(12) United States Patent
Lee et al.

(10) Patent No.: US 12,273,032 B2
(45) Date of Patent: Apr. 8, 2025

(54) CHARGER INTEGRATED CIRCUIT INCLUDING BIDIRECTIONAL SWITCHING CONVERTER, AND ELECTRONIC DEVICE INCLUDING THE CHARGER INTEGRATED CIRCUIT

(71) Applicant: Samsung Electronics Co., Ltd., Suwon-si (KR)

(72) Inventors: Sungwoo Lee, Suwon-si (KR); Hyoungseok Oh, Suwon-si (KR); Daewoong Cho, Suwon-si (KR); Jungwook Heo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 286 days.

(21) Appl. No.: 17/985,301

(22) Filed: Nov. 11, 2022

(65) Prior Publication Data

US 2023/0155507 A1 May 18, 2023

(30) Foreign Application Priority Data

Nov. 15, 2021 (KR) .................. 10-2021-0157096
May 24, 2022 (KR) .................. 10-2022-0063679

(51) Int. Cl.
*H02M 3/158* (2006.01)
*H02J 7/00* (2006.01)
(Continued)

(52) U.S. Cl.
CPC ......... *H02M 3/1582* (2013.01); *H02J 7/0068* (2013.01); *H02M 1/0095* (2021.05);
(Continued)

(58) Field of Classification Search
CPC ............. H02M 1/0095; H02M 3/1582; H02M 3/33584; H02M 7/4837; H02M 7/5395; H02J 7/0068; H03K 17/693
See application file for complete search history.

(56) References Cited

U.S. PATENT DOCUMENTS 8,436,591 B2    5/2013  Dearn
9,793,804 B2   10/2017  Zhang et al.
(Continued)

FOREIGN PATENT DOCUMENTS

CN    103746557 B    6/2017
CN    105763085 B   11/2018
(Continued)

*Primary Examiner* — Harry R Behm
(74) *Attorney, Agent, or Firm* — Harness, Dickey & Pierce, P.L.C.

(57) ABSTRACT

A charger integrated circuit includes a bidirectional switching converter including first to fourth switching elements connected in series, an inductor connected to a third switching element, and a capacitor connected to a second switching element and the third switching element, and a controller configured to generate, a first PWM signal and a second PWM signal based on sensing signals from the bidirectional switching converter, and a first switching signal controlling first and fourth switching elements based on the first PWM signal in response to an average of an inductor current being positive, a second switching signal controlling second and third switching elements based on the second PWM signal, and generate the first switching signal based on the second PWM signal, and the second switching signal based on the first PWM signal in response to the average value of the inductor current being negative.

15 Claims, 17 Drawing Sheets

(51) Int. Cl.
*H02M 1/00* (2006.01)
*H02M 3/335* (2006.01)
*H02M 7/483* (2007.01)
*H02M 7/5395* (2006.01)
*H03K 17/693* (2006.01)

(52) U.S. Cl.
CPC ..... *H02M 3/33584* (2013.01); *H02M 7/4837* (2021.05); *H02M 7/5395* (2013.01); *H03K 17/693* (2013.01)

(56) References Cited

U.S. PATENT DOCUMENTS

| | | | |
|---|---|---|---|
| 10,530,256 B1 | 1/2020 | Jayaraman et al. | |
| 2016/0020621 A1* | 1/2016 | Baby | H02J 7/0047 |
| | | | 320/128 |
| 2017/0250617 A1* | 8/2017 | Kondo | H02M 3/1588 |

FOREIGN PATENT DOCUMENTS

| | | |
|---|---|---|
| CN | 111628653 A | 9/2020 |
| CN | 109374996 B | 2/2021 |

* cited by examiner

CHARGER INTEGRATED CIRCUIT INCLUDING BIDIRECTIONAL SWITCHING CONVERTER, AND ELECTRONIC DEVICE INCLUDING THE CHARGER INTEGRATED CIRCUIT

CROSS-REFERENCE TO RELATED APPLICATIONS

This application is based on and claims priority under 35 U.S.C. § 119 to Korean Patent Application Nos. 10-2021-0157096 and 10-2022-0063679, filed on Nov. 15, 2021, and May 24, 2022, respectively, in the Korean Intellectual Property Office, the disclosures of which are incorporated by reference herein in their entireties.

BACKGROUND

With the rapid development of electronic devices, electronic devices capable of exchanging information or data have been used in various applications. Electronic devices use a rechargeable battery as a power supply and allow mobility of the electronic devices. The capacity of the battery is limited, and a user needs to properly charge the battery before the battery capacity is entirely exhausted. A travel adapter (TA) that enables charging of the battery may convert power supplied from an alternating current (AC) (at about 110 V to about 220 V for household power) or another power supply means (e.g., a computer), into direct current (DC) power necessary for charging the battery. Thus, the TA provides DC power to an electronic device. The electronic device may use the DC power converted by the TA to charge the battery.

Recently, mobile devices such as a smartphone and a tablet PC support a switching mode with various charging circuits to stably support wireless and wired operations even when input power is unstable during wired and wireless charging, while simultaneously supporting wired and wireless charging. However, an over-current may occur in the charging circuit when the switching mode transitions to another mode.

SUMMARY

Example embodiments relate to a bidirectional switching converter that supports a plurality of switching modes and seamlessly transitions the plurality of switching modes, a charger integrated circuit (IC) including the bidirectional switching converter, and an electronic device including the charger IC.

According to an example embodiment of the inventive concepts, there is provided a charger integrated circuit (IC) including a bidirectional switching converter including a plurality of switching elements including a first switching element, a second switching element, a third switching element, and a fourth switching element which are connected in series to a first input/output node, an inductor connected between a first end of the third switching element and a second input/output node, and a capacitor connected to a second end of the second switching element and a third end of the third switching element, and a controller configured to generate a first pulse width modulation (PWM) signal and a second PWM signal based on a plurality of sensing signals received from the bidirectional switching converter, in a buck-boost mode, a first switching signal controlling switching operations of the first switching element and the fourth switching element based on the first PWM signal, and a second switching signal controlling switching operations of the second switching element and the third switching element based on the second PWM signal in response to an average value of an inductor current flowing through the inductor being positive, and the first switching signal based on the second PWM signal, and the second switching signal based on the first PWM signal and in response to the average value of the inductor current being negative.

According to another example embodiment of the inventive concepts, there is provided a charger integrated circuit (IC) including a 3-level bidirectional switching converter and a controller, wherein the 3-level bidirectional switching converter includes a first switching element connected between a first node and a second node, a first input voltage is applied to or a first output voltage is output from the first node, a second switching element connected between the second node and a third node, a third switching element connected between the third node and a fourth node, a fourth switching element connected between the fourth node and a fifth node, a capacitor connected between the second node and the fourth node, and an inductor connected between the third node and a sixth node, and the controller is configured to, in a first switching mode, in response to an average current of the inductor having a positive value, turn on or off the first switching element and the fourth switching element based on a first pulse width modulation (PWM) signal, turn on and off the second switching element and the third switching element based on a second PWM signal, and in response to the average current of the inductor having a negative value, turn on or off the first switching element and the fourth switching element based on the second PWM signal, and turn on and off the second switching element and the third switching element based on the first PWM signal.

According to another example embodiment of the inventive concepts, there is provided an electronic device including a battery and a charger integrated circuit (IC) configured to form a first power path in a first direction to charge the battery based on a first switching operation in a buck mode, form a second power path in a second direction opposite to the first direction based on a second switching operation to provide power to an external device based on a voltage charged in the battery in a boost mode, and charge the battery based on a third switching operation or supply the power to the external device in a buck-boost mode, wherein the charger IC includes a switching circuit including a plurality of switching elements, an inductor, and a capacitor, and the charger IC is further configured to adjust periods in which each of a plurality of switching voltages applied to the plurality of switching elements has an active level and an inactive level according to a direction of an inductor current flowing through the inductor in the buck-boost mode.

BRIEF DESCRIPTION OF THE DRAWINGS

Example embodiments of the inventive concepts will be more clearly understood from the following detailed description taken in conjunction with the accompanying drawings.

In order to more fully understand the drawings recited in the detailed description of the inventive concepts, a brief description of each drawing is provided.

DETAILED DESCRIPTION OF THE EXAMPLE EMBODIMENTS

Hereinafter, example embodiments of the inventive concepts will be described in detail with reference to the accompanying drawings.

Figure 1:
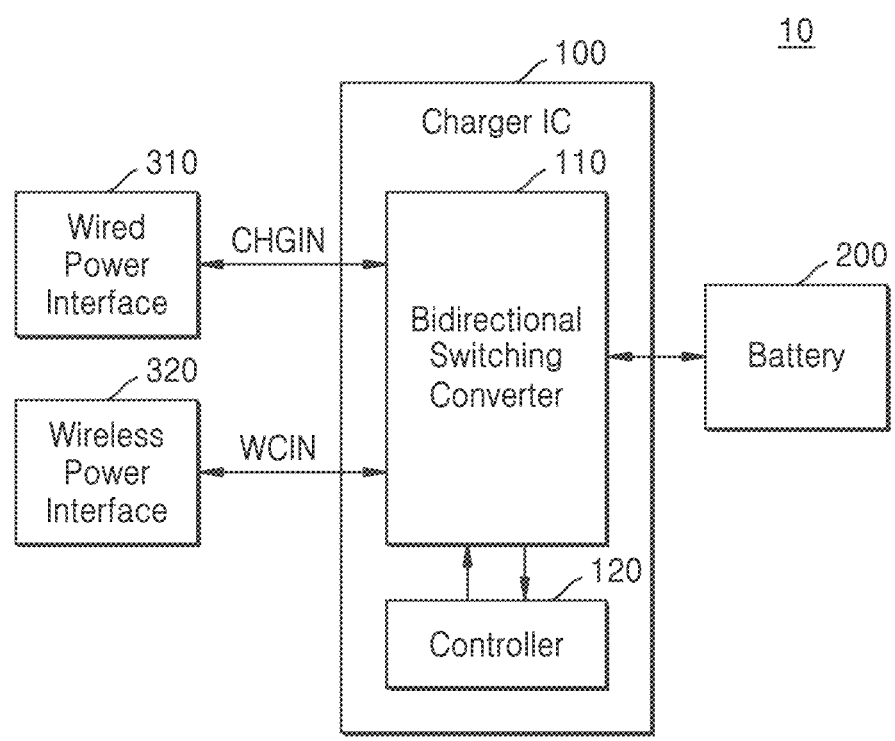
FIG. 1 is a block diagram schematically illustrating an electronic device including a charger integrated circuit (IC) according to some example embodiments.

FIG. 1 is a block diagram schematically illustrating an electronic device 10 including a charger integrated circuit (IC) 100 according to some example embodiments.

Referring to FIG. 1, the electronic device 10 may include the charger IC 100 and a battery 200. Besides, the electronic device 10 may further include a main processor and peripheral devices. For example, the electronic device 10 may be a mobile device such as a smart phone, a tablet personal computer (PC), a mobile phone, a personal digital assistant (PDA), a laptop, a wearable device, a global positioning system (GPS) device, an e-book terminal, a digital broadcasting terminal, an MP3 player, a digital camera, etc. For example, the electronic device 10 may be an electric vehicle.

The battery 200 may be embedded in the electronic device 10. In some example embodiments, the battery 200 may be detachable from the electronic device 10. The battery 200 may include one or a plurality of battery cells. A plurality of battery cells may be connected to each other in series or parallel. When an external charging device is not connected to the electronic device 10, the battery 200 may supply power to the electronic device 10.

The charger IC 100 may charge the battery 200 and may be referred to as a "battery charger". In addition, the charger IC 100 may supply power to an external device (e.g., a wired power interface 310 or a wireless power interface 320) connected to the charger IC 100 based on a voltage charged in the battery 200. For example, the charger IC 100 may be implemented as one or more integrated circuit chips, and may be mounted on a printed circuit board.

The charger IC 100 may include a bidirectional switching converter 110 and a controller 120. The bidirectional switching converter 110 may be implemented as a 3-level DC-DC converter including a plurality of switching elements Q1, Q2, Q3, and Q4 in FIG. 2, a flying capacitor $C_F$ in FIG. 2, and an inductor L in FIG. 2. Here, the 3-level means the number of voltage levels used for a switching operation. The 3-level DC-DC converter may generate an output voltage by switching an input voltage, a (½)*input voltage, and a ground voltage (e.g., 0 V). The bidirectional switching converter 110 may perform a buck converting operation of generating an output voltage by stepping down an input voltage or a boost converting operation of generating an output voltage by boosting the input voltage.

When the bidirectional switching converter 110 steps down the input voltage, that is, during the buck converting operation, a first power path may be formed in a first direction in which power is supplied to the battery 200 from at least one external device connected through the wired power interface 310 and/or the wireless power interface 320, and, when the bidirectional switching converter 110 boosts the input voltage, that is, during the boost converting operation, a second power path may be formed in a second direction through which power is supplied from the battery 200 to the at least one external device. Hereinafter, in the example embodiments, the first direction will be referred to as a forward direction, and the second direction will be referred to as a reverse direction. Accordingly, the buck converting operation of the bidirectional switching converter 110 will be used along with a forward buck converting operation, and the boost converting operation will be used along with a reverse boosting converting operation.

The bidirectional switching converter 110 may operate in a buck mode (also called a forward buck mode or a buck single mode), a boost mode (also called a reverse boost mode or a boost single mode) or a buck-boost mode (also called a forward buck-reverse boost mode or a buck-boost composite mode).

In the buck mode, the bidirectional switching converter 110 may step down an input voltage by performing the forward buck converting operation, and may charge the battery 200 based on the step-down voltage. In the boost mode, the bidirectional switching converter 110 may boost a voltage input from the battery 200 by performing the reverse boost converting operation, and may supply power to an external device based on the boosted voltage. In the buck-boost mode, the bidirectional switching converter 110 may perform the forward buck converting operation or the reverse boosting converting operation according to an amount of power supplied from a connected external device or an amount of power supplied to the external device.

The controller 120 may control a mode transition between a plurality of switching modes of the bidirectional switching converter 110, for example, the forward buck mode, the reverse boost mode, and the forward buck-reverse boost mode. Also, the controller 120 may control a switching operation of the bidirectional switching converter 110 according to the switching mode.

The controller 120 may control the switching operation of the bidirectional switching converter 110 so that an output voltage of the bidirectional switching converter 110 may maintain a target level, for example, a first target level set with respect to the output voltage. In addition, the controller 120 may control the switching operation of the bidirectional switching converter 110 so that a voltage (hereinafter referred to as a flying capacitor voltage) between both ends of a flying capacitor ($C_F$ in FIG. 2) provided in the bidirectional switching converter 110 may maintain a target level, for example, a second target level set with respect to the flying capacitor voltage.

The controller 120 may generate switching signals for controlling a switching operation of the bidirectional switching converter 110 in each switching mode. For example, the controller 120 may receive sensing currents and voltages from the bidirectional switching converter 110, and generate switching signals based on the sensing currents and the voltages. The controller 120 may generate a first pulse width modulation (PWM) signal and a second PWM signal based on the sensing currents and the voltages, generate a first switching signal and a second switching signal based on the first PWM signal and the second PWM signal, and provide the first switching signal and the second switching signal to the bidirectional switching converter 110. At least two switching elements among a plurality of switching elements provided in the bidirectional switching converter 110 may be turned on and off based on the first switching signal, and at least two other switching elements may be turned on and turned off based on the second switching signal.

In some example embodiments, in the buck-boost mode, the controller 120 may control the flying capacitor voltage to maintain the second target voltage by adjusting an on period and an off period of each of (or alternatively, at least one of) the first switching signal and the second switching signal, based on whether an average value of an inductor current flowing through an inductor L provided in the bidirectional switching converter 110 is positive or negative.

The controller 120 may determine whether the average value of the inductor current is positive or negative based on the sensed currents from the bidirectional switching converter 110. In the buck mode and the boost mode, the controller 120 may control the inductor current flowing through the inductor L to flow in one direction. For example, in the buck mode, the controller 120 may control the inductor current to flow in a forward direction (e.g., from a first end of the inductor L to a second end) and not to flow in a reverse direction (e.g., from the second end of the inductor L to first end), and in the boost mode, may control the inductor current to flow in the reverse direction and not to flow in the forward direction. The controller 120 may control the inductor current to flow in both directions in the buck-boost mode. When the inductor current flows in the forward direction, the inductor current has a positive value, and when the inductor current flows in the reverse direction, the inductor current may have a negative value.

The controller 120 may determine whether the average value of the inductor current is positive or negative for a unit time, when the average value of the inductor current is positive, generate the first switching signal based on the first PWM signal, and generate the second switching signal based on the second PWM signal. When the average value of the inductor current is negative, the controller 120 may generate the first switching signal based on the second PWM signal and generate the second switching signal based on the first PWM signal.

As such, generating the first switching signal and the second switching signal based on whether the average value of the inductor current is positive or negative will be described below with reference to FIGS. 2 to 11.

In some example embodiments, the charger IC 100 may support at least one function among various functions such as an under-voltage lockout (UVLO) function, an over-current protection (OCP) function, an over-voltage protection (OVP) function, a soft-start function to reduce an inrush current, a foldback current limit function, a hiccup mode function for short circuit protection, an over-temperature protection (OTP) function, etc.

In some example embodiments, the electronic device 10 may support wired charging and wireless charging, and may include a wired power interface 310 and a wireless power interface 320 respectively for wired charging and wireless charging. In some example embodiments, the wired power interface 310 may include a wired charging circuit, and the wireless power interface 320 may include a wireless charging circuit. For example, each of (or alternatively, at least one of) the wired charging circuit and the wireless charging circuit may include a rectifier, a regulator, etc.

The charger IC 100 may receive a first input voltage CHGIN from the wired power interface 310 and/or a second input voltage WCIN from the wireless power interface 320, and charge the battery 200 based on the first input voltage CHGIN and/or the second input voltage WCIN in the buck mode.

The charger IC 100 may provide power to the wired power interface 310 and/or the wireless power interface 320 based on the voltage of the battery 200 in the reverse boost mode.

The charger IC 100 may receive the first input voltage CHGIN from the wired power interface 310, and charge the battery 200 based on the first input voltage CHGIN or provide power to the wireless power interface 320 based on the first input voltage CHGIN in the buck-boost mode. Alternatively, the charger IC 100 may receive the second input voltage WCIN from the wireless power interface 320 and charge the battery 200 based on the second input voltage WCIN or provide power to the wired power interface 310 based on the second input voltage WCIN. Charging the battery 200 and providing power to the wired power interface 310 or the wireless power interface 320 may be simultaneously or contemporaneously performed.

The charger IC 100 may also provide power to the wireless power interface 320 based on the first input voltage CHGIN and the voltage of the battery 200 or provide power to the wired power interface 310 based on the second input voltage WCIN and the voltage of the battery 200.

For example, a travel adapter (TA) or an auxiliary battery may be electrically connected to the wired power interface 310. The TA may convert power supplied from alternating current (AC) about 110 V to about 220 V which is household power or another power supply means (e.g., a computer) into direct current (DC) power necessary for charging the battery 200, and provide the DC power to the electronic device 10. In the buck mode or the buck-boost mode, the charger IC 100 may charge the battery 200 using the first input voltage CHGIN received from the TA or the auxiliary battery, or provide power to the wireless power interface 320.

For example, an on the go (OTG) device (e.g., an OTG USB device, etc.) may be connected to the wired power interface 310, and the charger IC 100 may provide power to the OTG device through the wired power interface 310. In this regard, the charger IC 100 may provide power to the OTG device based on the voltage of the battery 200 in the boost mode, or provide power to the OTG device simultaneously or contemporaneously while charging the battery 200 based on the second input voltage WCIN of the wireless power interface 320 in the buck mode.

For example, a wireless power receiving circuit or a wireless power transmitting circuit may be connected to the wireless power interface 320. The charger IC 100 may charge the battery 200 using the second input voltage WCIN received from the wireless power receiving circuit in the buck mode or the buck-boost mode. Alternatively, the charger IC 100 may provide power to the wireless power transmitting circuit through the wireless power interface 320. The charger IC 100 may provide power to the wireless power transmitting circuit based on the voltage of the battery 200 in the boost mode, or provide power to the wireless power transmitting circuit simultaneously or contemporaneously while charging the battery 200 based on the first input voltage CHGIN of the wired power interface 310 in the buck mode.

As described above, because the electronic device 10 supports wired and wireless charging, the charger IC 100 may operate in the plurality of switching modes including the buck mode, the boost mode, and the buck-boost mode in order to support wired charging and/or wireless charging, wired charging-wireless power supply, and wireless charging-wired power supply.

As described above, in the charger IC 100 according to some example embodiments, the bidirectional switching converter 110 may be implemented as the 3-level DC-DC converter including the plurality of switching elements, the flying capacitor (e.g., $C_F$ in FIG. 2), and the inductor L. The charger IC 100 may maintain the flying capacitor voltage at the second target level by changing the control of switching operations of the plurality of switching elements according to whether the average value of the inductor current flowing through the inductor L is positive or negative in the buck-boost mode. This may be referred to as flying capacitor balancing. In this way, an operation transition may be seamlessly performed between the buck converting operation and the boost converting operation while flying capacitor balancing is maintained in the buck-boost mode, FIG. 2 is a circuit diagram illustrating the bidirectional switching converter 110 according to some example embodiments.

Figure 2:
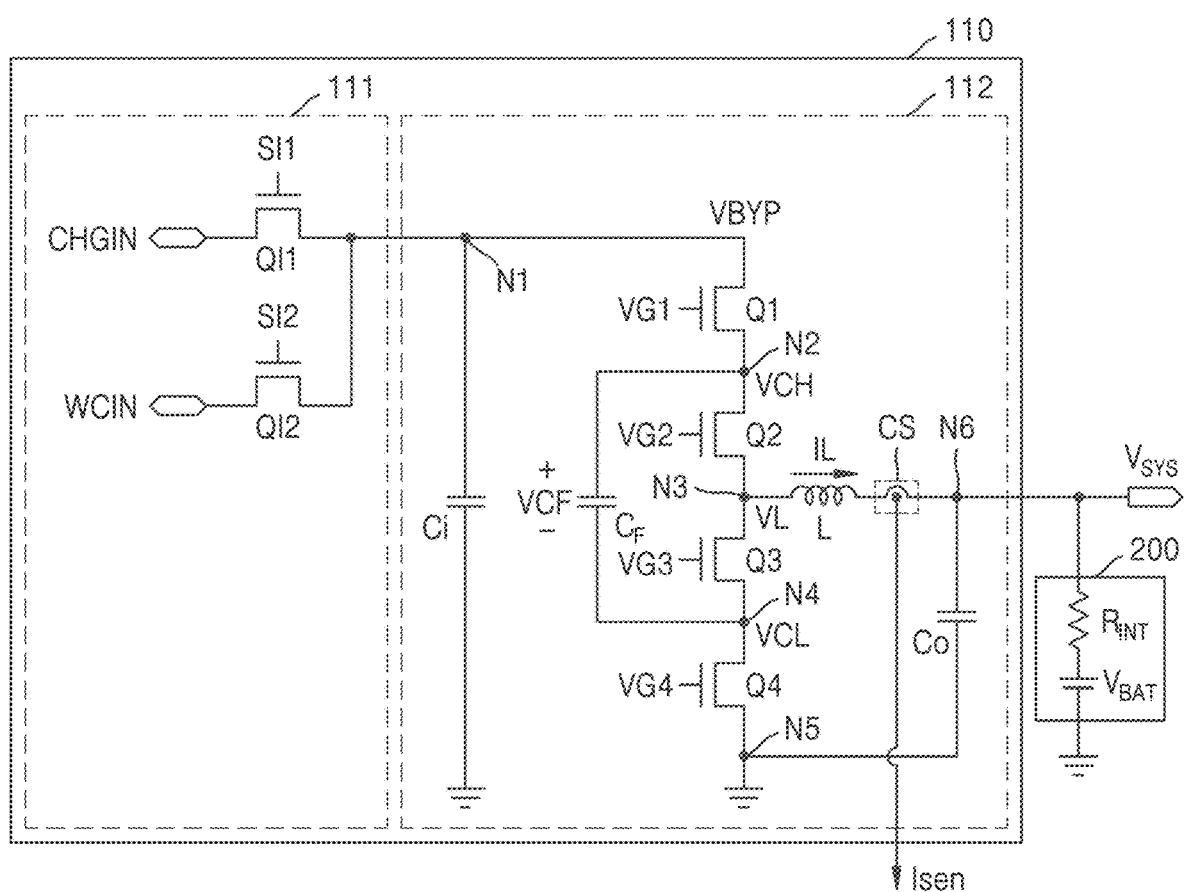
FIG. 2 is a circuit diagram illustrating a bidirectional switching converter according to some example embodiments.

Referring to FIG. 2, the bidirectional switching converter 110 may include an input/output selection circuit 111 and a switching circuit 112.

The input/output selection circuit 111 may include a first input transistor QI1 and a second input transistor QI2. The first input transistor QI1 and the second input transistor QI2 may be connected in parallel to a first node N1. The first node N1 may be referred to as a first input/output node.

The first input voltage CHGIN may be applied to the first input transistor QI1 or an OTG device may be connected to the first input transistor QI1. The second input voltage WCIN may be applied to the second input transistor QI2 or a wireless power transmitting circuit may be connected to the second input transistor QI2.

The first input transistor QI1 may be turned on and off in response to a first input control signal SI1, and the second input transistor QI2 may be turned on and turned off in response to a second input control signal SI2. For example, when the first input voltage CHGIN is applied to the first input transistor QI1 or the OTG device is connected to the first input transistor QI1, the first input control signal SI1 may have an active level, and the first input transistor QI1 may be turned on in response to the first input control signal SI1. When the second input voltage WCIN is applied to the second input transistor QI2 or the wireless power transmitting circuit is connected to the second input transistor QI2, the second input control signal SI2 may have an active level, and the second input transistor QI2 may be turned on in response to the second input control signal SI2. The first input control signal SI1 and the second input control signal SI2 may be received from the controller (120 of FIG. 1).

The switching circuit 112 may include a plurality of switching elements, for example, a first switching transistor Q1, a second switching transistor Q2, a third switching transistor Q3 and a fourth switching transistor Q4, the inductor L, a first capacitor Ci, a second capacitor Co, a third capacitor $C_F$, and a current sensor CS.

The first capacitor Ci may stabilize an input voltage applied to the first input node N1 when the switching circuit 112 performs a buck converting operation, and rectify an output voltage of square waves output to the first node N1 into a DC voltage when the switching circuit 112 performs a boost converting operation.

The first switching transistor Q1, the second switching transistor Q2, the third switching transistor Q3, and the fourth switching transistor Q4 may be connected in series to the first node N1. A first end of the first switching transistor Q1 may be connected to the first node N1, and a second end thereof may be connected to a second node N2. A first end of the second switching transistor Q2 may be connected to the second node N2, and a second end thereof may be connected to a third node N3. A first end of the third switching transistor Q3 may be connected to the third node N3, and a second end thereof may be connected to a fourth node N4. A first end of the fourth switching transistor Q4 may be connected to the fourth node N4, and a second end thereof may be connected to a fifth node N5. A ground voltage may be applied to the fifth node N5.

The first switching transistor Q1 may be turned on and turned off in response to a first switching voltage VG1, the second switching transistor Q2 may be turned on and turned off in response to a second switching voltage VG2, the third switching transistor Q3 may be turned on and turned off in response to a third switching voltage VG3, and the fourth switching transistor Q4 may be turned on and turned off in response to a fourth switching voltage VG4.

The first to fourth switching voltages VG1, VG2, VG3, and VG4 may be periodic signals having a frequency, and the frequency may vary according to a step-down ratio during a buck converting operation and a step-up ratio during a boost converting operation.

The first switching voltage VG1 and the fourth switching voltage VG4 may be complementary signals, and the second switching voltage VG2 and the third switching voltage VG3 may be complementary signals. Accordingly, the first switching transistor Q1 and the fourth switching transistor Q4 may perform a complementary switching operation, and the second switching transistor Q2 and the third switching transistor Q3 may perform a complementary switching operation.

A third capacitor $C_F$ may be connected to the second node N2 and the fourth node N4. In other words, a first end of the capacitor $C_F$ may be connected to the second end of the first switching transistor Q1 and the first end of the second switching transistor Q2, and a second end of the capacitor $C_F$ may be connected to the second end of the third switching transistor Q3 and the first end of the fourth switching transistor Q4. The capacitor $C_F$ may be referred to as a flying capacitor.

The inductor L may be connected to the third node N3 and a sixth node N6. The sixth node N6 may be referred to as a second input/output node. The second capacitor Co may be connected to the sixth node N6.

The inductor L may store energy generated by an inductor current IL flowing through the inductor L, and discharge the stored energy. According to the buck converting operation and the boost converting operation of the bidirectional switching converter 110, the inductor current IL may flow in a direction from the third node N3 to the sixth node N6, for example, in a forward direction, or the inductor current IL may flow in a direction from the sixth node N6 node to the third node N3, for example, in a reverse direction. It may be assumed that when the inductor current IL flows in the forward direction, a value of the inductor current IL is positive, and when the inductor current IL flows in the reverse direction, the value of the inductor current IL is negative.

The current sensor CS may be a bidirectional current sensor that senses the inductor current IL. The current sensor CS may provide a sensing current Isen to the controller (120 of FIG. 1). One current sensor CS sensing the inductor current IL is illustrated in FIG. 2 but the inventive concepts are not limited thereto, and the switching circuit 112 may further include at least one current sensor sensing at least one current flowing through at least one of the first switching transistor Q1, the second switching transistor Q2, the third switching transistor Q3, or the fourth switching transistor Q4.

The respective voltages of the first node N1, the second node N2, the third node N3, and the fourth node N4, for example, a voltage VBYP, a voltage VCH, a voltage VL, and a voltage VCL, may be provided to the controller (120 in FIG. 1), and the controller 120 may generate the first to fourth switching voltages VG1 to VG4 based on a plurality of voltages and at least one sensing current provided from the bidirectional switching converter 110.

The bidirectional switching converter 110 may operate as a buck converter in a partial period of the buck mode or the buck-boost mode, and may generate a first output voltage by stepping-down the first voltage VBYP. Here, the first voltage VBYP may be the first input voltage CHGIN and/or the second input voltage WCIN. The first output voltage may be output as a system voltage $V_{SYS}$ through the sixth node N6, that is, the second input/output node. Also, the battery 200 may be charged based on the first output voltage. The battery 200 may include an internal resistor $R_{INT}$, and a battery voltage $V_{BAT}$ of the charged battery 200 may be the same as the first output voltage.

The bidirectional switching converter 110 may operate as a boost converter in another partial period of the boost mode or the buck-boost mode, and may generate an output voltage, for example, a second output voltage, by boosting the battery voltage $V_{BAT}$. The second output voltage may be output through the first node N1, that is, the first input/output node, and the bidirectional switching converter 110 may provide power to the wired power interface (310 in FIG. 1) and/or the wireless power interface (320 in FIG. 1) based on the second output voltage.

Figure 3A:
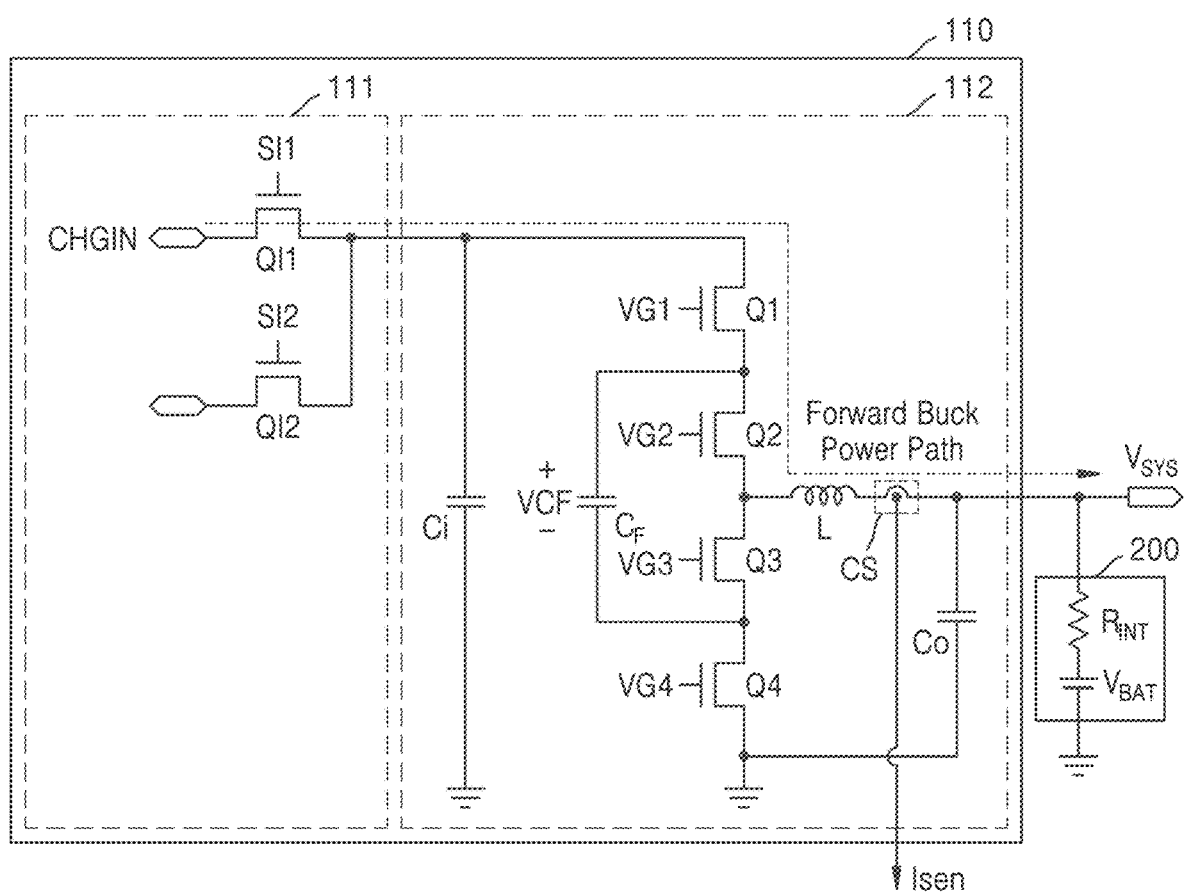
FIGS. 3A and 3B illustrate a power path during a buck converting operation of a bidirectional switching converter according to some example embodiments.
Figure 3B:
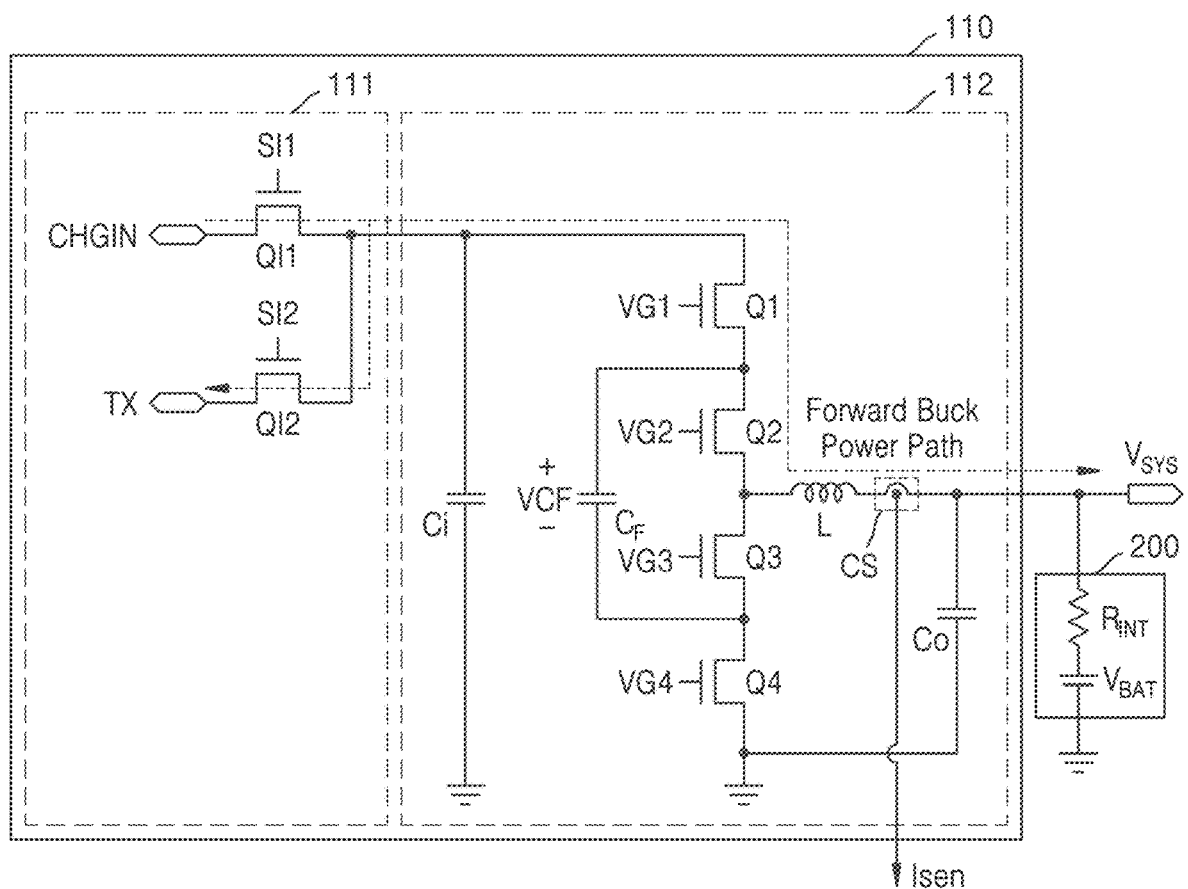

FIGS. 3A and 3B illustrate a power path during a buck converting operation of the bidirectional switching converter 110 according to some example embodiments. It is assumed that the first input voltage CHGIN is applied to the input/output selection circuit 111 in FIG. 3A, and that the first input voltage CHGIN is applied to the input/output selection circuit 111, and a wireless power transmitting circuit TX is connected to the input/output selection circuit 111 in FIG. 3B.

Referring to FIG. 3A, the first input voltage CHGIN may be applied from a first input power source, for example, the wired power interface 310 of FIG. 1, and the first input transistor QI1 may be turned on in response to the first input control signal SI1 having an active level. In this regard, the second input control signal SI2 may have an inactive level, and the second input transistor QI2 may be turned off in response to the second input control signal SI2.

The bidirectional switching converter 110 may operate as a buck converter in a forward direction. The bidirectional switching converter 110 may perform a switching operation based on the first input voltage CHGIN, and accordingly, a first power path (a forward buck power path) may be formed in the forward direction. Current supplied from the first input power source may be supplied to the battery 200 and/or an internal system of the electronic device 10 through the inductor L. As described above, the bidirectional switching converter 110 may charge the battery 200 and supply power to the internal system of the electronic device (10 in FIG. 1) by performing the buck converting operation.

Referring to FIG. 3B, the wired power interface (310 in FIG. 1) as well as the wireless power interface (320 in FIG. 1), for example, the wireless power transmitting circuit TX, may be connected to the input/output selection circuit 111, and the second input transistor QI2 may be turned on in response to the second input control signal SI2 having an active level.

The first input power source may provide power to the wireless power transmitting circuit TX through the first input transistor QI1 and the second input transistor QI2. Accordingly, in addition to the first power path formed according to the buck converting operation of the bidirectional switching converter 110, the power path may be formed in a direction from the wired power interface 310 to the wireless power interface 320 in the input/output selection circuit 111.

FIGS. 3A and 3B illustrate a forward buck power path formed when the bidirectional switching converter 110 performs a forward buck converting operation based on the first input voltage CHGIN provided from the wired power interface 310. However, the inventive concept is not limited thereto, and the bidirectional switching converter 110 may perform the forward buck converting operation based on the second input voltage WCIN provided from the wireless power interface 320. The forward buck power path may be formed based on the second input voltage WCIN, and the power path may be formed in a direction from the wireless power interface 320 to the wired interface 310 in the input/output selection circuit 111.

Figure 4A:
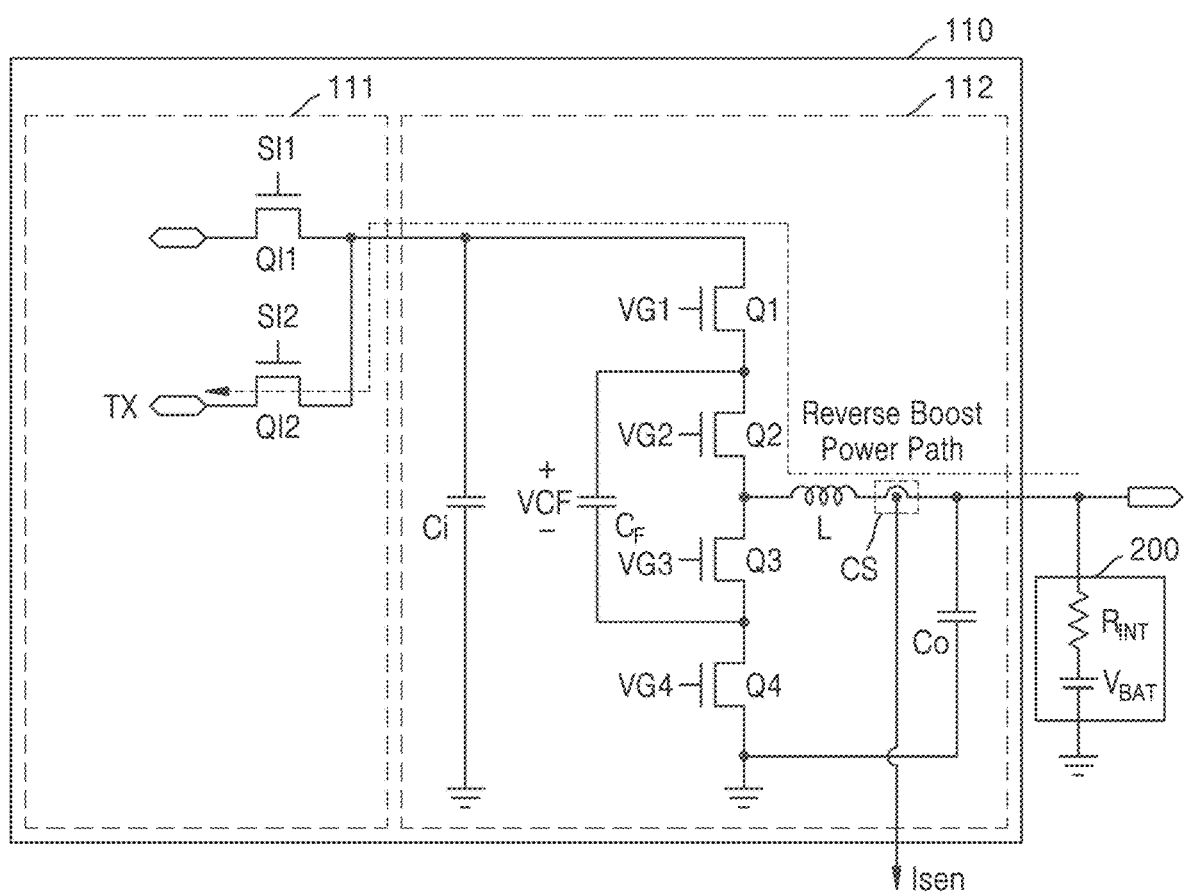
FIGS. 4A and 4B illustrate a power path during a boost converting operation of a bidirectional switching converter according to some example embodiments.
Figure 4B:
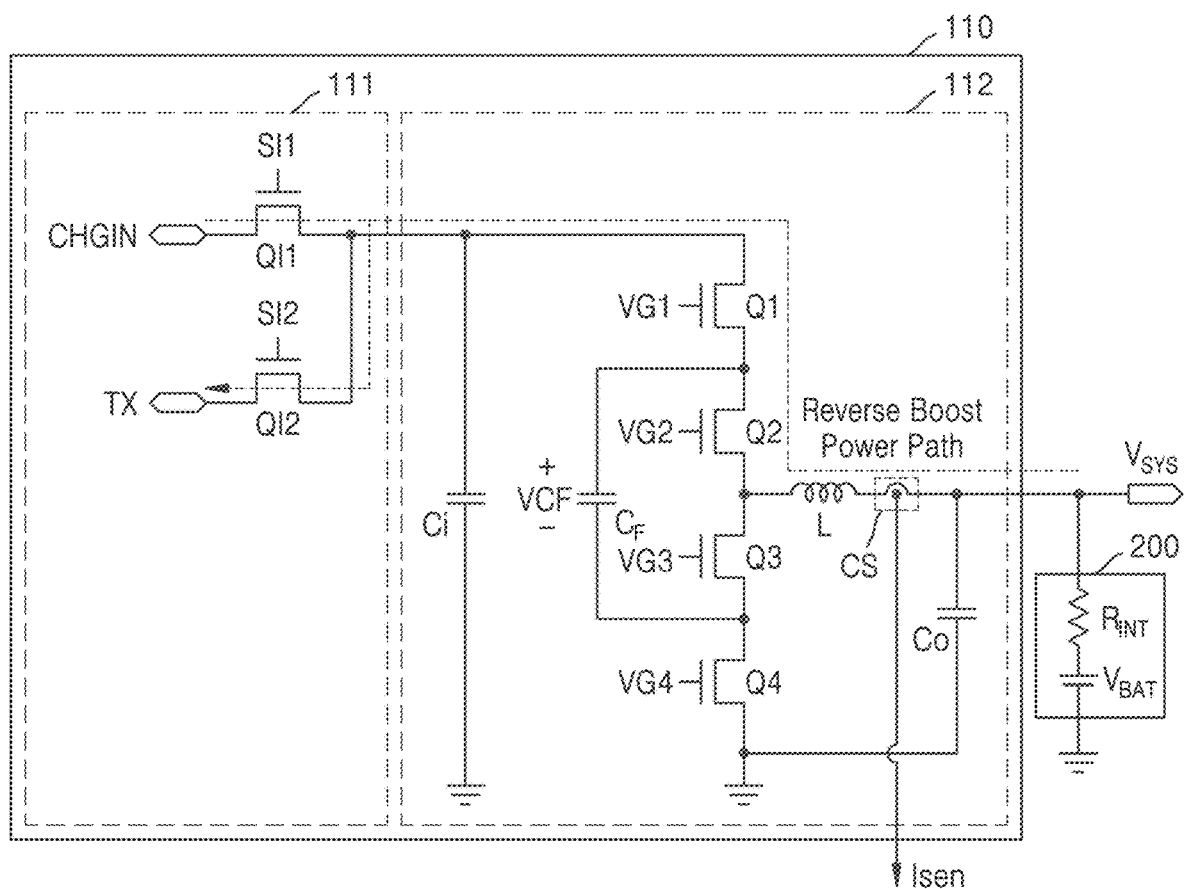

FIGS. 4A and 4B illustrate a power path during a boost converting operation of the bidirectional switching converter 110 according to some example embodiments. It is assumed that the wireless power transmitting circuit TX is connected to the input/output selection circuit 111 in FIG. 4A, and that the first input voltage CHGIN is applied to the input/output selection circuit 111 and the wireless power transmitting circuit TX is connected to the input/output selection circuit 111 in FIG. 4B.

Referring to FIG. 4A, the wireless power transmitting circuit TX may be connected to the input/output selection circuit 111. The second input transistor QI2 may be turned on in response to the second input control signal SI2 having an active level. The first input control signal SI1 may have an inactive level, and the first input transistor QI1 may be turned off in response to the first input control signal SI1.

The bidirectional switching converter 110 may operate as a boost converter in a reverse direction. The bidirectional switching converter 110 may perform a switching operation based on an input voltage provided to the battery 200, for example, the battery voltage $V_{BAT}$, and accordingly, a second power path, for example, a reverse boost power path, may be formed in the reverse direction. Current supplied from the battery 200 may be provided to the wireless power transmitting circuit TX through the inductor L.

In some example embodiments, an OTG device may be connected to the input/output selection circuit 111, and the current supplied from the battery 200 may be provided to the OTG device.

Referring to FIG. 4B, the wireless power transmitting circuit TX may be connected to the input/output selection circuit 111, and the first input voltage CHGIN may be applied to the input/output selection circuit 111. The first input transistor QI1 and the second input transistor QI2 may be turned on in response to the first input control signal SI1 and the second input control signal SI2 having an active level.

Current supplied from a first input power source providing the first input voltage CHGIN, for example, the wired power interface 310 of FIG. 1, may be provided to the wireless power transmitting circuit TX. Accordingly, in addition to the second power path formed according to the boost converting operation of the bidirectional switching converter 110, a power path may be formed in a direction from the wired power interface 310 to the wireless power interface 320 in the input/output selection circuit 111.

In some example embodiments, the OTG device may be connected to the input/output selection circuit 111, and the second input voltage WCIN may be applied from the wireless power interface (320 of FIG. 1). Current supplied from a second power source may be provided to the OTG device based on the current supplied from the battery 200 and the second input voltage WCIN.

Figure 5A:
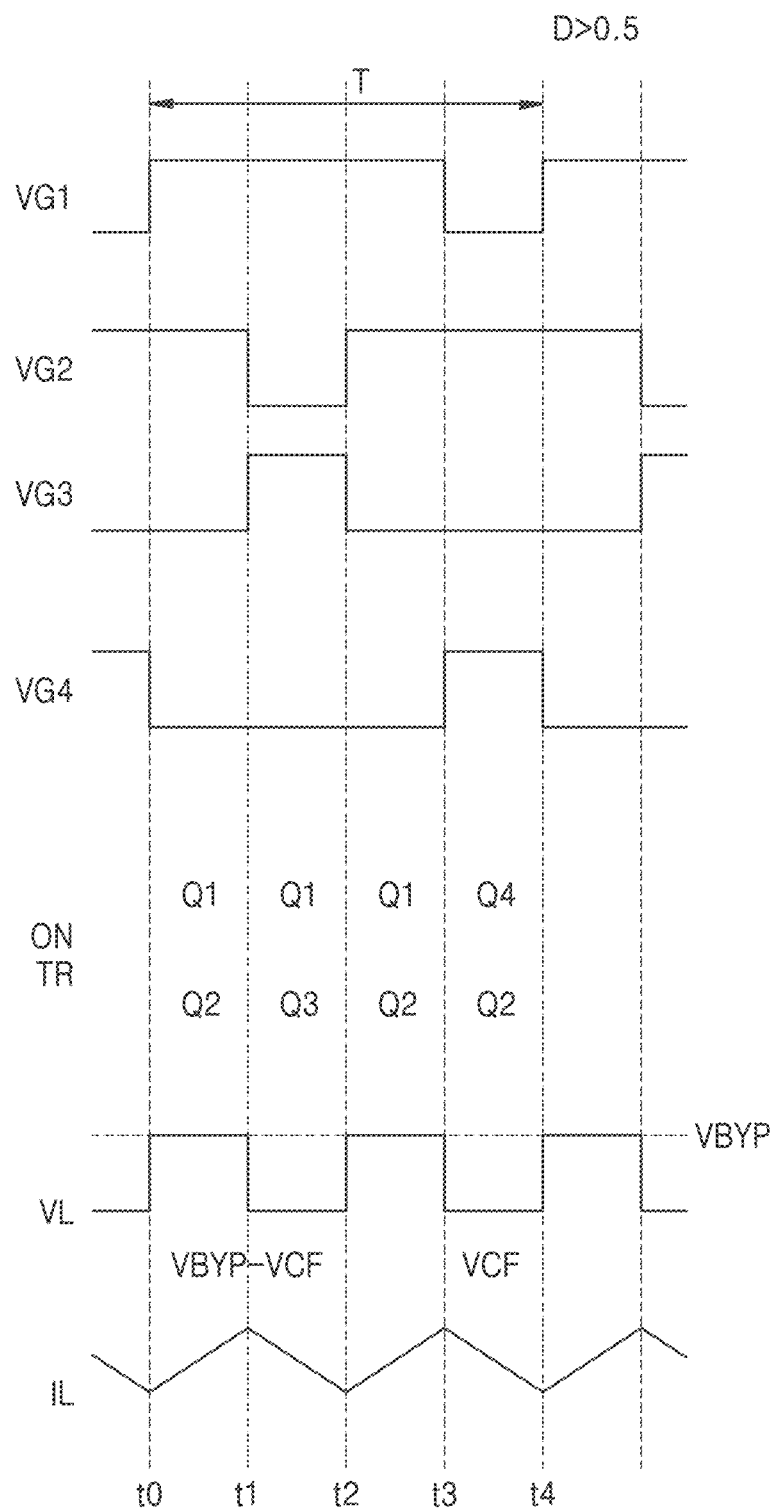
FIGS. 5A and 5B are timing diagrams when a bidirectional switching converter performs a buck converting operation according to some example embodiments.
Figure 5B:
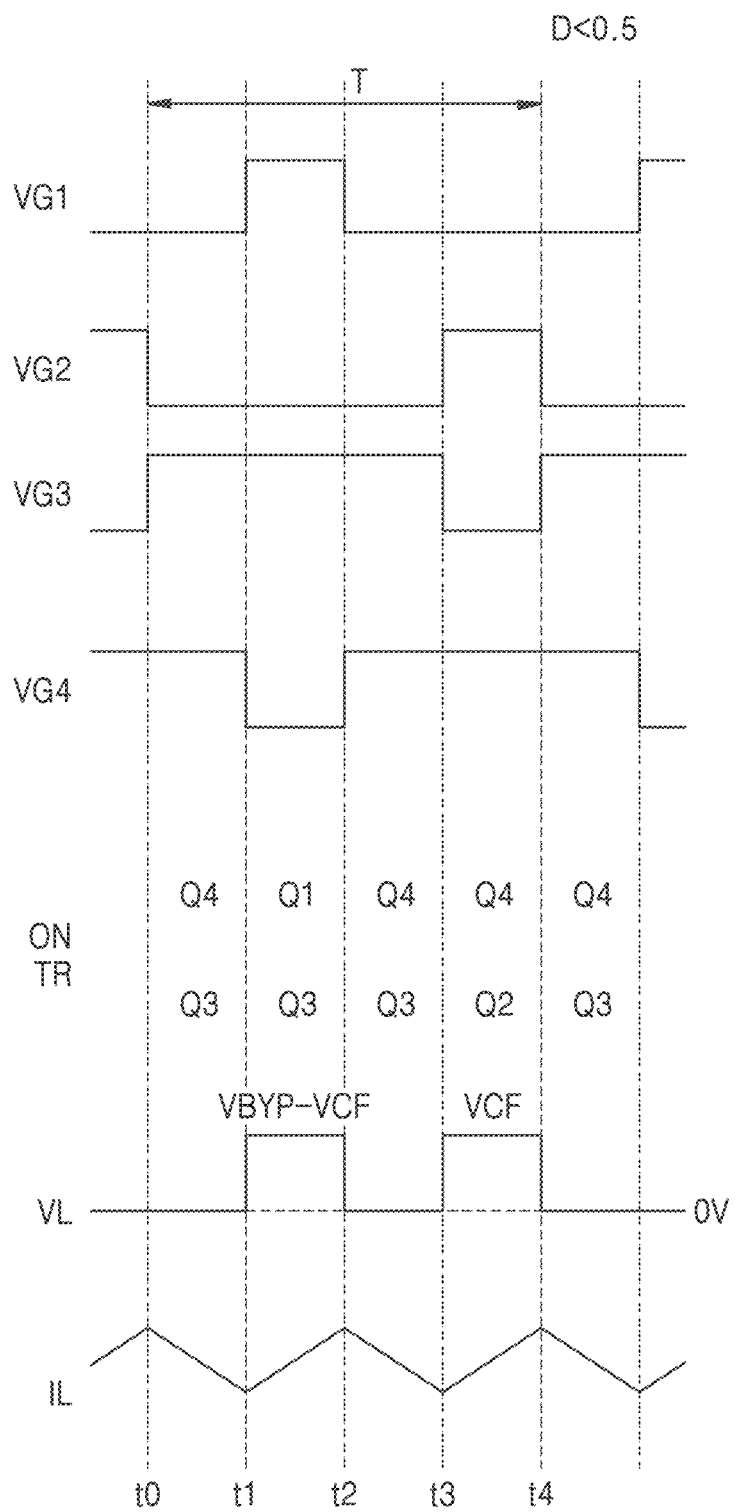

FIGS. 5A and 5B are timing diagrams when the bidirectional switching converter 110 performs a buck converting operation according to some example embodiments. FIG. 5A is a waveform diagram when a duty ratio D is more than 0.5, and FIG. 5B is a waveform diagram when the duty ratio D is equal to or less than 0.5. FIGS. 5A and 5B will be described with reference to FIG. 2 together.

Referring to FIGS. 2 and 5A, the bidirectional switching converter 110 may perform the buck converting operation based on the first to fourth switching voltages VG1 to VG4. For example, when the first switching voltage VG1 is at an active level (e.g., logic high), the first switching transistor Q1 may be turned on, and when the first switching voltage VG1 is at an inactive level (e.g., logic low), the first switching transistor Q1 may be turned off.

The first to fourth switching voltages VG1 to VG4 are signals of the same frequency. A period in which each of (or alternatively, at least one of) the first to fourth switching voltages VG1 to VG4 has the active level and the inactive level within one period T may be varied based on a ratio of an input voltage to an output voltage and feedback voltages of the switching circuit 112.

The first switching voltage VG1 and the fourth switching voltage VG4 are complementary signals, and the second switching voltage VG2 and the third switching voltage VG3 are complementary signals. Accordingly, when the first switching transistor Q1 is turned on, the fourth switching transistor Q4 may be turned off, and when the first switching transistor Q1 is turned off, the fourth switching transistor Q4 may be turned on. When the second switching transistor Q2 is turned on, the third switching transistor Q3 may be turned off, and when the second switching transistor Q2 is turned off, the third switching transistor Q3 may be turned on.

At a time t0, when the first switching transistor Q1 and the second switching transistor Q2 are turned on, an input voltage, for example, the voltage VBYP of the first node N1, may be applied to the third node N3, the voltage VL of the third node N3 may have the same voltage level as that of the voltage VBYP, and the inductor current IL may increase.

At a time t1, when the second switching transistor Q2 is turned off and the third switching transistor Q3 is turned on, current may flow to the inductor L through the first switching transistor Q1, a third capacitor $C_F$, and the third switching transistor Q3. The voltage VL of the third node N3 may have a voltage level reduced by a voltage VCF between both ends of the third capacitor $C_F$ from the voltage VBYP. For example, when the voltage VCF is ½ times the voltage VBYP (e.g., ½×VBYP), the voltage VL may have the same level (e.g., ½×VBYP) as that of the voltage VCF. Due to a reduction in the level of the voltage VL, the inductor current IL may be reduced.

At a time t2, when the third switching transistor Q3 is turned off and the second switching transistor Q2 is turned on, the voltage VL of the third node N3 may have the same level as that of the voltage VBYP, and the inductor current IL may increase.

At a time t3, when the fourth switching transistor Q4 is turned on and the first switching transistor Q1 is turned off, the current may flow to the inductor L through the fourth switching transistor Q4, the third capacitor $C_F$, and the second switching transistor Q2. The voltage VL of the third node N3 may have the same level (e.g., ½*VBYP) as that of the voltage VCF, and due to a reduction in the level of the voltage VL, the inductor current IL may be reduced.

Referring to FIG. 5B, when the fourth switching transistor Q4 and the third switching transistor Q3 are turned on at the time t0, a ground voltage may be applied to the third node N3 and the voltage VL of the third node N3 may have the same level as that of the ground voltage. The inductor current IL generated by the energy charged in the inductor L may be output, and the inductor current IL may be reduced.

At the time t1, when the fourth switching transistor Q4 is turned off and the first switching transistor Q1 is turned on, the current may flow to the inductor L through the first switching transistor Q1, the third capacitor $C_F$, and the third switching transistor Q3. The voltage VL of the third node N3 may have a level reduced by the voltage VCF between both ends of the third capacitor $C_F$ from the voltage VBYP. For example, when the voltage VCF is ½ times the voltage VBYP (e.g., ½*VBYP), the voltage VL may have a level (e.g., ½*VBYP) that is ½ times the voltage VBYP. Due to an increase in the level of the voltage VL, the inductor current IL may increase.

At the time t2, when the fourth switching transistor Q4 is turned on and the first switching transistor Q1 is turned off, the voltage VL of the third node N3 may have the same level as that of the ground voltage, and the inductor current IL may be reduced.

At the time t3, when the second switching transistor Q2 is turned on and the third switching transistor Q3 is turned off, the current may flow to the inductor L through the fourth switching transistor Q4, the third capacitor $C_F$, and the second switching transistor Q2. The voltage VL of the third node N3 may have the same level (e.g., ½*VBYP) as that of the voltage VCF, and the inductor current IL may increase.

As described above with reference to FIGS. 5A and 5B, switching operations of the first to fourth switching transistors Q1 to Q4 may be repeated for one period T, and accordingly, an output voltage obtained by stepping-down the input voltage, for example, the voltage VBYP, may be output through the sixth node N6. Here, a voltage drop rate may be determined according to the duty ratio D.

Meanwhile, in the bidirectional switching converter 110 implemented as a 3-level DC-DC converter, the voltage VL may be determined by the voltage VBYP and the voltage VCF as described above. The controller 120 may reduce a ripple of the output voltage, by controlling the voltage VCF between both ends of the third capacitor $C_F$ to be an intermediate value of the voltage VBYP. As described above, controlling the voltage VCF between both ends of the third capacitor $C_F$ to the intermediate value of the voltage VBYP will be referred to as flying capacitor balancing.

In the buck mode, the inductor current IL flows in a forward direction, and in the boost mode, the inductor current IL flows in a reverse direction. However, in the buck-boost mode, the inductor current IL may flow in both directions. In the buck-boost mode, the controller 120 may control the bidirectional switching converter 110 to perform a switching operation according to the buck mode or the boost mode. However, depending on the direction of the inductor current IL, the bidirectional switching converter 110 may perform a buck converting operation or a boost converting operation.

For example, in a case where the first to fourth switching voltages VG1 to VG4 are provided as shown in FIGS. 5A and 5B, when the inductor current IL flows in the forward direction, the bidirectional switching converter 110 may perform the buck converting operation in the forward direction, and when the inductor current IL flows in the reverse direction, the bidirectional switching converter 110 may perform the boost converting operation in the reverse direction.

The bidirectional switching converter 110 may perform the buck converting operation in the forward direction based on the first input voltage applied to the first node N1, for example, the voltage VBYP, and generate the first output voltage output to the sixth node N6. In addition, the bidirectional switching converter 110 may perform the boost converting operation in the reverse direction based on the input voltage applied to the sixth node N6, for example, the battery voltage $V_{BAT}$, and generate the second output voltage output to the first node N1.

Meanwhile, when the bidirectional switching converter 110 performs the buck converting operation in the forward direction and the boost converting operation in the reverse direction based on the first to fourth switching voltages VG1 to VG4 as described above, flying capacitor balancing may be difficult. However, as will be described below, the controller 120 according to some example embodiments may perform flying capacitor balancing by adjusting a period in which each of (or alternatively, at least one of) the first to fourth switching voltages VG1 to VG4 has the active level and the inactive level according to the direction of the inductor current IL when the bidirectional switching converter 110 performs the buck converting operation in the forward direction and the boost converting operation in the reverse direction.

Figure 6:
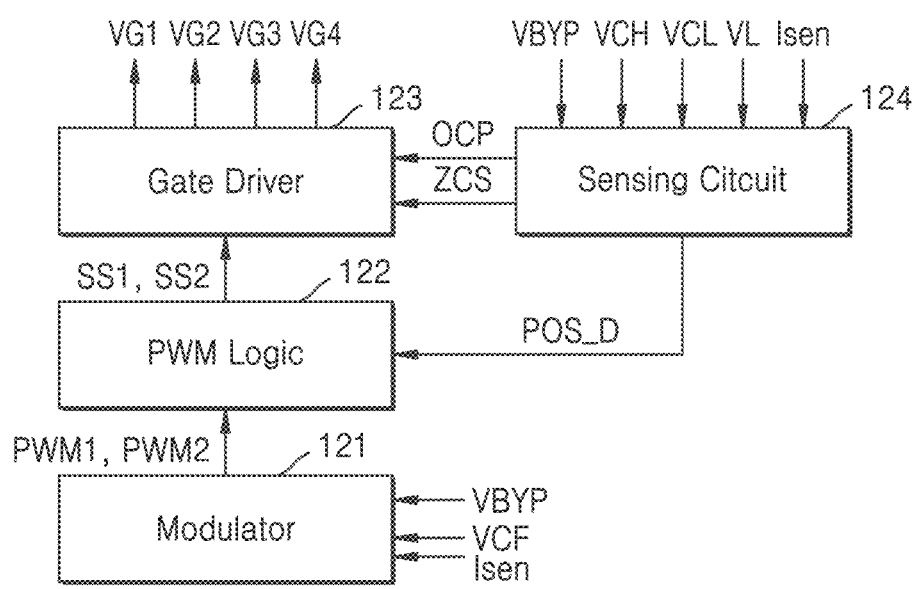
FIG. 6 is a block diagram schematically illustrating a controller controlling a bidirectional switching converter according to some example embodiments.

FIG. 6 is a block diagram schematically illustrating the controller 120 controlling the bidirectional switching converter 110 according to some example embodiments.

Referring to FIG. 6, the controller 120 may include a modulator 121, a PWM logic 122, a gate driver 123, and a sensing circuit 124.

The modulator 121 may generate a first PWM signal PWM1 and a second PWM signal PWM2 based on voltages and sensing current provided from the bidirectional switching converter (110 of FIG. 1). In some example embodiments, the modulator 121 may generate the first PWM signal PWM1 and the second PWM signal PWM2 based on the voltages VBYP and VCF and the sensing current Isen, for example, the inductor current (IL in FIG. 2), provided from the bidirectional switching converter 110.

Figure 7:
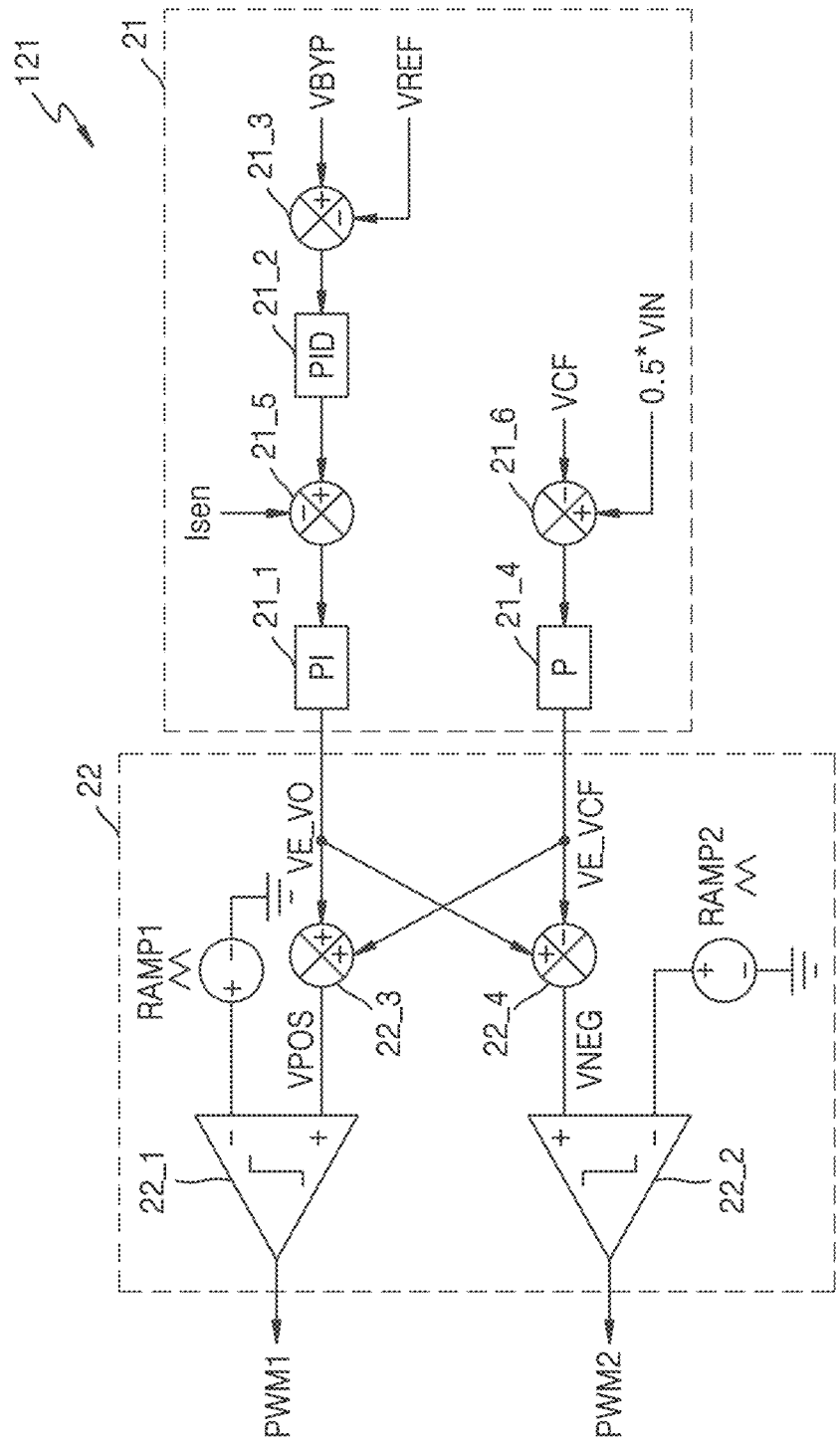
FIG. 7 is a circuit diagram schematically illustrating a modulator of FIG. 6.

FIG. 7 is a circuit diagram schematically illustrating the modulator 121 of FIG. 6.

Referring to FIG. 7, the modulator 121 may include an error detection circuit 21 and a comparison circuit 22.

The error detection circuit 21 may detect an error of am output voltage, e.g., a first error voltage VE_VO and an error of a capacitor voltage, e.g., a second error voltage VE_VCF, based on the voltage VBYP and the voltage VCF. The error detection circuit 21 may include a plurality of controllers, for example, a proportional integral (PI) controller 21_1, a proportional integral derivative (PID) controller 21_2, a proportional (P) controller 21_4, and a plurality of adders 21_3, 21_5 and 21_6.

An error of the voltage VBYP according to a difference between the voltage VBYP and the reference voltage VREF may be output from the adder 21_3. The PID controller 21_2 may generate a control value obtained by summing a proportional value, an integral value, and a differential value of the error of the voltage VBYP. A current error according to a difference between the control value output from the PID controller 21_2 and the sensing current Isen may be output from the adder 21_5. The PI controller 21_1 may output the first error voltage VE_VO obtained by adding a proportional value and an integral value of the current error.

An error of the voltage VCF according to a difference between the voltage VCF and a voltage (e.g., 0.5*VIN) corresponding to ½ times the input voltage VIN may be output from the adder 21_6. The P controller 21_4 may output a proportional value of the error of the voltage VCF as the second error voltage VE_VCF.

The comparison circuit 22 may include a first comparator 22_1, a second comparator 22_2, and a plurality of adders 22_3 and 22_4. The adder 22_3 may output the sum of the first error voltage VE_VO and the second error voltage VE_VCF as a first comparison voltage VPOS. The adder 22_4 may output a difference between the first error voltage VE_VO and the second error voltage VE_VCF as a second comparison voltage VNEG. A voltage level of the first error voltage VE_VO may be higher than a voltage level of the second error voltage VE_VCF, and a voltage level of the first comparison voltage VPOS may be higher than a voltage level of the second comparison voltage VNEG.

The first comparator 22_1 may output the first PWM signal PWM1 by comparing a first ramp signal RAMP1 and the first comparison voltage VPOS. For example, when a level of the first ramp signal RAMP1 is lower than that of the first comparison voltage VPOS, the first comparator 22_1 may output the first PWM signal PWM1 having an active level, and when the level of the first ramp signal RAMP1 is equal to or higher than that of the first comparison voltage VPOS, the first comparator 22_1 may output the first PWM signal PWM1 having an inactive level.

The second comparator 22_2 may output the second PWM signal PWM2 by comparing a second ramp signal RAMP2 and the second comparison voltage VNEG. For example, when a level of the second ramp signal RAMP2 is lower than that of the second comparison voltage VNEG, the second comparator 22_2 may output the second PWM signal PWM2 having an active level, and when the level of the second ramp signal RAMP2 is equal to or higher than that of the second comparison voltage VNEG, the second comparator 22_2 may output the second PWM signal PWM2 having an inactive level.

Figure 8:
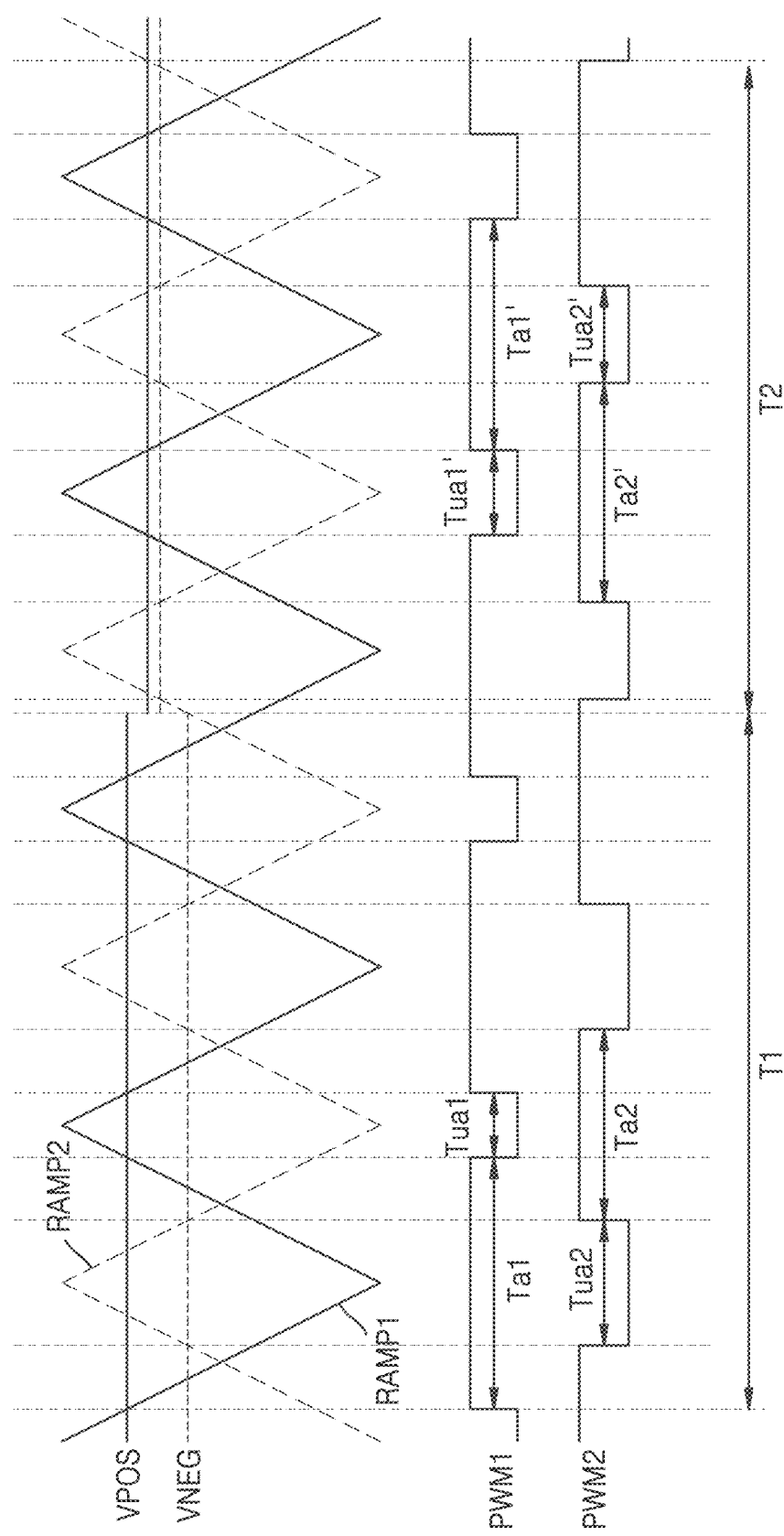
FIG. 8 is a timing diagram illustrating first and second pulse width modulation (PWM) signals generated by the modulator of FIG. 7.

FIG. 8 is a timing diagram illustrating the first and second PWM signals PWM1 and PWM2 generated by the modulator 121 of FIG. 7.

Referring to FIG. 8, a voltage level of the first comparison voltage VPOS in a first period T1 is higher than the voltage level thereof in a second period T2, and a voltage level of the second comparison voltage VNEG in the first period T1 is lower than the voltage level thereof in the second period T2. When a second error voltage VE_VCF in the second period T2 is lower than in the first period T1, the first comparison voltage VPOS may be reduced and the second comparison voltage VNEG may increase. As another example, when the first error voltage VE_VO in the second period T2 is lower than in the first period T1, both the first comparison voltage VPOS and the second comparison voltage VNEG may be reduced.

The first PWM signal PWM1 may be generated based on a comparison result of the first comparison voltage VPOS and the first ramp signal RAMP1, and the second PWM signal PWM2 may be generated based on a comparison result of the second comparison voltage VNEG and the second ramp signal RAMP2.

Accordingly, a period Ta1' in which the first PWM signal PWM1 may have an active level in the second period T2 may be reduced compared to a period Ta1 in which the first PWM signal PWM1 has an active level in the first period T1, and a period Tua1' in which the first PWM signal PWM1 has an inactive level in the second period T2 may be increased compared to a period Tua1 in which the first PWM signal PWM1 has an inactive level in the first period T1.

A period Ta2' in which the second PWM signal PWM2 has an active level in the second period T2 may be increased compared to a period Ta2 in which the second PWM signal PWM2 has an active level in the first period T1, and a period Tua2' in which the second PWM signal PWM2 has an inactive level in the second period T2 may be reduced compared to a period Tua2 in which the second PWM signal PWM2 has an inactive level in the first period T1. As such, based on a change in voltage level of each of (or alternatively, at least one of) the first comparison voltage VPOS and the second comparison voltage VNEG, the periods in which each of (or alternatively, at least one of) the first PWM signal PWM1 and the second PWM signal PWM2 has an active level and an inactive period may be changed.

Subsequently, referring to FIG. 6, the PWM logic 122 may generate a first switching signal SS1 and a second switching signal SS2 based on the first PWM signal PWM1, the second PWM signal PWM2, and a direction signal POSD_D.

Figure 9:
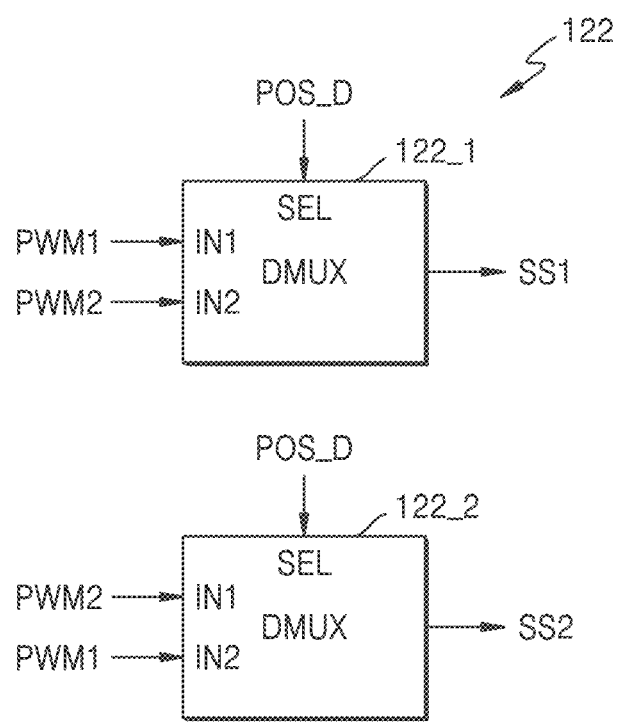
FIG. 9 is a circuit diagram schematically illustrating a PWM logic of FIG. 6.

FIG. 9 is a circuit diagram schematically illustrating the PWM logic 122 of FIG. 6.

Referring to FIG. 9, the PWM logic 122 may include a first de-multiplexer (DMUX) 122_1 and a second de-multiplexer 122_2. The first de-multiplexer 122_1 and the second de-multiplexer 122_2 may output respectively output signals, for example, the first switching signal SS1 and the second switching signal SS2, based on the direction signal POS_D as a selection input SEL.

The first de-multiplexer 122_1 may receive the first PWM signal PWM1 as a first input IN1 and the second PWM signal PWM2 as a second input IN2. The first de-multiplexer 122_1 may output one of the first input IN1 and the second input IN2 as the first switching signal SS1 based on the direction signal POS_D. For example, when the direction signal POS_D is at a logic high, the first de-multiplexer 122_1 may output the first input IN1, for example, the first PWM signal PWM1, as the first sensing signal SS1, when the direction signal POS_D is at a logic low, the first de-multiplexer 122_1 may output the second input IN2, for example, the second PWM signal PWM2, as the first switching signal SS1.

The second de-multiplexer 122_2 may receive the second PWM signal PWM2 as the first input IN1, and receive the first PWM signal PWM1 as the second input IN2. The second de-multiplexer 122_2 may output one of the first input IN1 and the second input IN2 as the second switching signal SS2 based on the direction signal POS_D. For example, when the direction signal POS_D is at a logic high, the second de-multiplexer 122_2 may output the first input IN1, e.g., the second PWM signal PWM2, as the first switching signal SS1, and when the direction signal POS_D is at a logic low, the second de-multiplexer 122_2 may output the second input IN2, for example, the first PWM signal PWM1, as the second sensing signal SS1.

Accordingly, when the direction signal POS_D is at a logic high, the PWM logic 122 may output the first PWM signal PWM1 as the first switching signal SS1 and output the second PWM signal PWM2 as the second switching signal SS2, and when the direction signal POS_D is at a logic low, the PWM logic 122 may output the second PWM signal PWM2 as the first switching signal SS1, and the first PWM signal PWM1 as the second switching signal SS2.

Subsequently, referring to FIG. 6, the gate driver 123 may generate the first to fourth switching voltages VG1, VG2, VG3, and VG4 based on the first switching signal SS1 and the second switching signal SS2.

The gate driver 123 may convert a voltage level of the first switching signal SS1 to generate the first switching voltage VG1, and invert the first switching signal SS1 and convert the voltage level to generate the fourth switching voltage VG4. For example, the gate driver 123 may convert a logic low level of the first switching signal SS1 to a voltage level suitable for turning off the first switching transistor (Q1 in FIG. 2), and convert the logic high level to a voltage level suitable for turning on the first switching transistor Q1.

The gate driver 123 may convert a voltage level of the second switching signal SS2 to generate the second switching voltage VG2, and invert the second switching signal SS2 and convert the voltage level to generate the third switching voltage VG3.

As described with reference to FIG. 6, the first switching signal SS1 and the second switching signal SS2 are changed according to the direction signal POS_D, and thus, the first to fourth switching voltages VG1, VG2, VG3, and VG4 may be changed.

In some example embodiments, the gate driver 123 may receive an over-current control signal OCP and a zero current control signal ZCS from the sensing circuit 124, and generate or block the first to fourth switching voltages VG1, VG2, VG3, and VG4, based on the over-current control signal OCP and the zero current control signal ZCS.

For example, when the inductor current IL is reduced to a certain value, for example, '0', when the bidirectional switching converter (110 in FIG. 1) operates in a buck-mode, the sensing circuit 124 may generate the zero current control signal ZCS. The gate driver 123 may block generation of the first to fourth switching voltages VG1, VG2, VG3, and VG4. Accordingly, it is possible to prevent or reduce the inductor current IL from flowing in a reverse direction.

When the inductor current IL increases to a certain value, for example, '0', when the bidirectional switching converter 110 operates in a boost-mode, the sensing circuit 124 may generate the over-current control signal OCP. The gate driver 123 may block the generation of the first to fourth switching voltages VG1, VG2, VG3, and VG4. Accordingly, it is possible to prevent or reduce the inductor current IL from flowing in a forward direction.

The sensing circuit 124 may generate the direction signal POS_D based on a plurality of voltages (e.g., the voltages VBYP, VCH, VCL, and VL) and the sensing current Isen provided from the bidirectional switching converter 110. Also, the sensing circuit 124 may generate the over-current control signal OCP and the zero current control signal ZCS.

For example, the sensing circuit 124 may average the sensing current Isen from which the inductor current IL is sensed for each certain unit time to calculate an average value of the inductor current IL, generate the direction signal POS_D at a logic high when the average value is positive, and generate the direction signal POS_D at a logic low when the average value is negative.

However, the inventive concept is not limited thereto, and the sensing circuit 124 may generate the direction signal POS_D according to various methods. For example, the sensing circuit 124 may generate the over-current control signal OCP and the zero current control signal ZCS with respect to each of (or alternatively, at least one of) the first to fourth switching transistors (Q1 to Q4 in FIG. 2), and generate the direction signal POS_D based on the over-current control signals OCP and the zero current control signals ZCS.

The sensing circuit 124 may detect intermediate points at which the inductor current IL is charged and discharged based on the first PWM signal PWM1 and the second PWM signal PWM2, and sense the third and fourth switching transistors Q3 and Q4 at the intermediate points when the direction signal POS_D is at a logic high. The sensing circuit 124 may change the direction signal POS_D from a logic high to a logic low when the zero current control signal ZCS is generated with respect to the third and fourth switching transistors Q3 and Q4. Also, the sensing circuit 124 may sense currents of the first and second switching transistors Q1 and Q2 at the intermediate points when the direction signal POS_D is at a logic low. When the over-current control signal OCP is generated with respect to the first and second switching transistors Q1 and Q2, the sensing circuit 124 may change the direction signal POS_D from a logic low to a logic high.

Figure 10A:
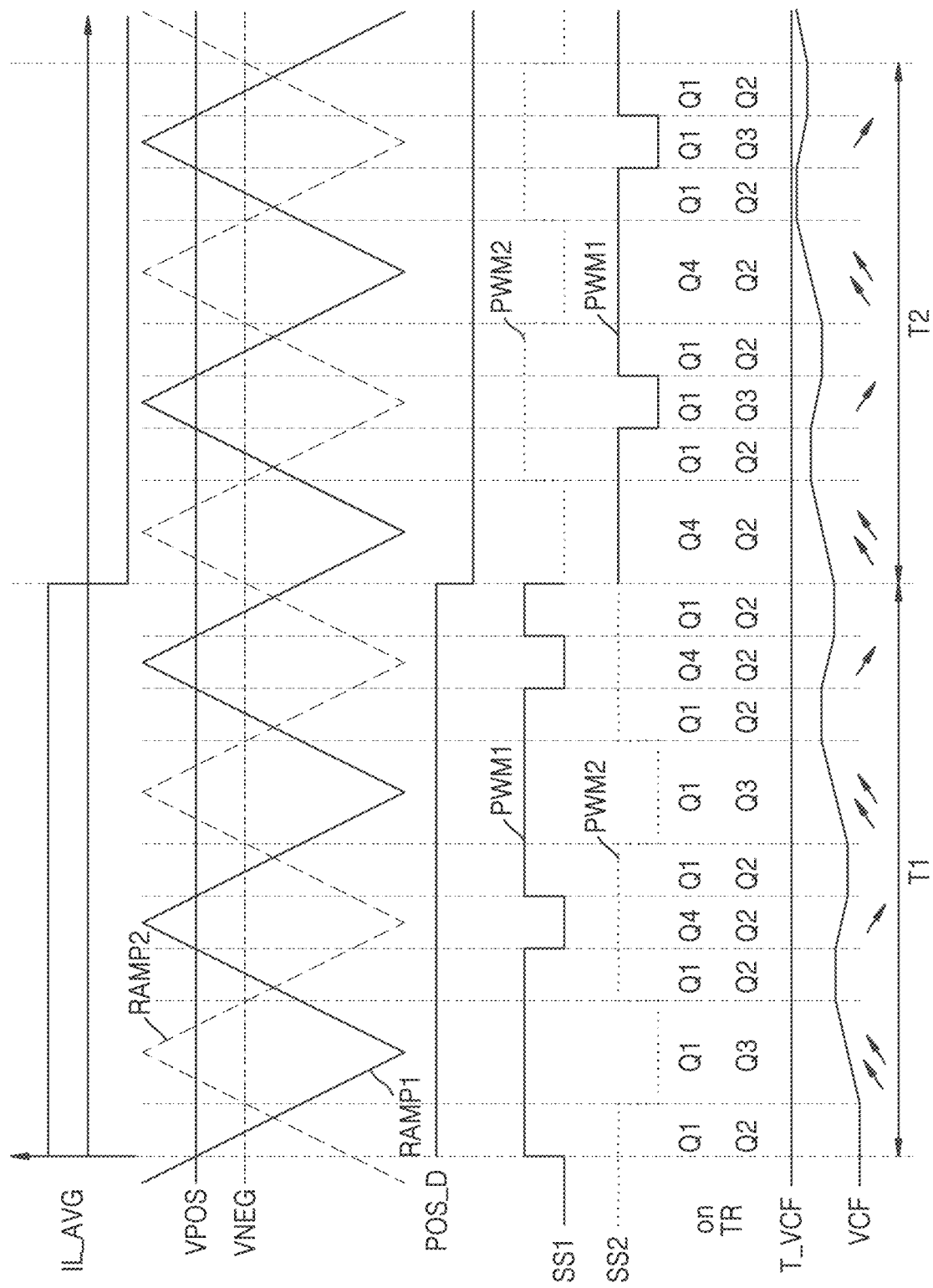
FIGS. 10A and 10B are timing diagrams of signals of a bidirectional switching converter and a controller according to some example embodiments.
Figure 10B:
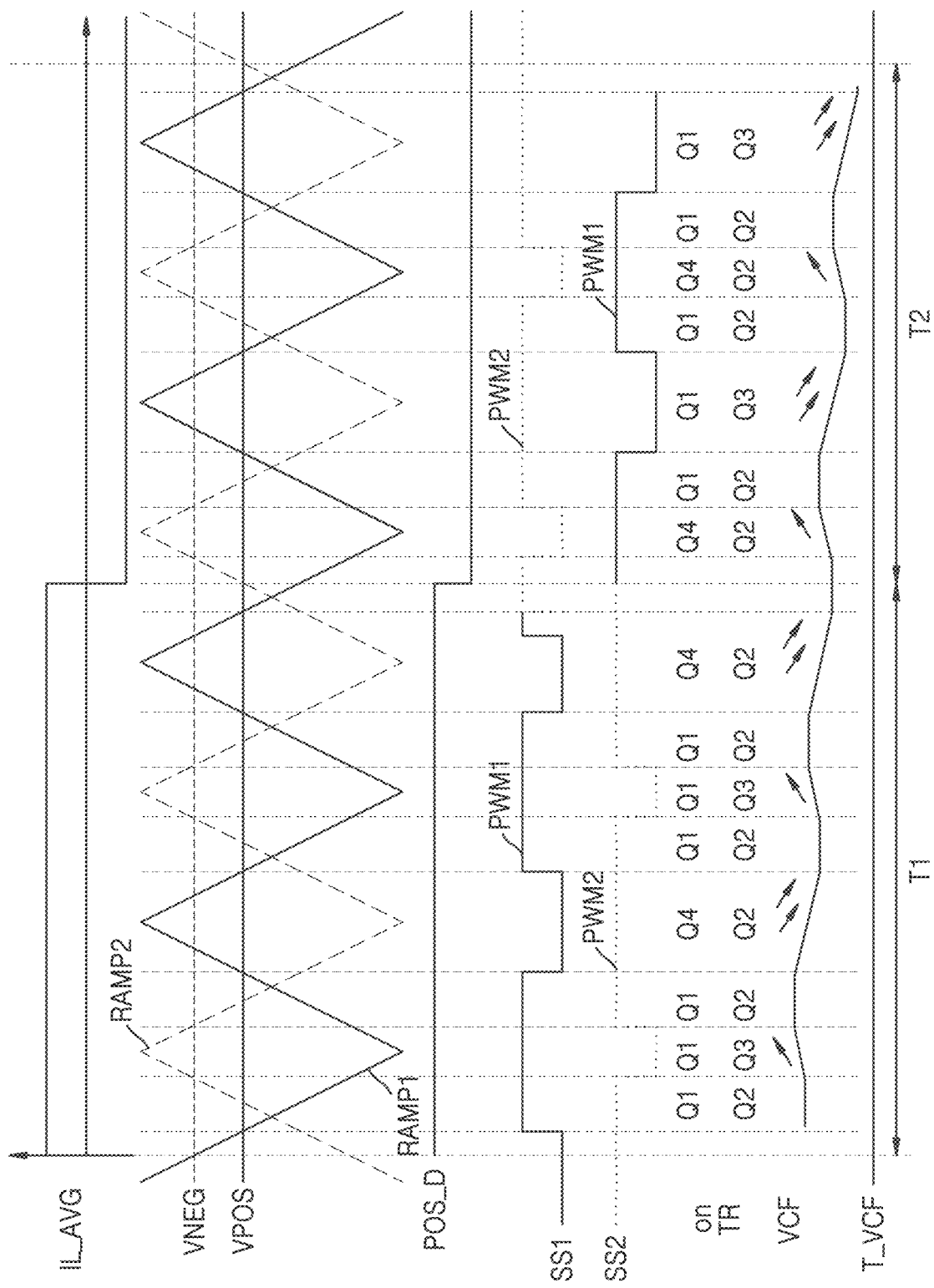

FIGS. 10A and 10B are timing diagrams of signals of the bidirectional switching converter 110 and the controller 120 according to some example embodiments. In FIG. 10A, it is assumed that the voltage VCF is less than a target voltage T_VCF, and in FIG. 10B, it is assumed that the voltage VCF is higher than the target voltage T_VCF.

Referring to FIG. 10A, when the voltage VCF is less than the target voltage T_VCF, the first comparison voltage VPOS may be higher than the second comparison voltage VNEG. In the period T1, an average value IL_AVG of an inductor current may be positive, and in the period T2, the average value IL_AVG of the inductor current may be negative. As described with reference to FIG. 7, the first PWM signal PWM1 may be generated based on the first ramp signal RAMP1 and the first comparison voltage VPOS, and the second PWM signal PWM2 may be generated based on the second ramp signal RAMP2 and the second comparison voltage VNEG.

Because the average value IL_AVG of the inductor current in the period T1 is positive, the direction signal POS_D is at a logic high, and in response to the direction signal POS_D at a logic high, the PWM logic (122 in FIG. 6) may generate the first switching signal SS1 based on the first PWM signal PWM1, and generate the second switching signal SS2 based on the second PWM signal PWM2.

As described with reference to FIGS. 5A and 5B, current flows through the third capacitor $C_F$ which is a flying capacitor during a period in which the first switching transistor Q1 and the third switching transistor Q3 are turned on and during a period in which the second switching transistor Q2 and the fourth switching transistor Q4 are turned on. When the average value IL_AVG of the inductor current is positive, because current flows in a forward direction, for example, from the second node N2 to the fourth node N4, during the period in which the first switching transistor Q1 and the third switching transistor Q3 are turned on, the third capacitor $C_F$ may be charged, and the voltage level of the voltage VCF may increase. Meanwhile, because current flows in a reverse direction, for example, from the fourth node N4 to the second node N2, during the period in which the second switching transistor Q2 and the fourth switching transistor Q4 are turned on, the third capacitor $C_F$ may be discharged, and the voltage level of the voltage VCF may be reduced.

In the period T1, the period in which the first switching transistor Q1 and the third switching transistor Q3 are turned on is longer than the period in which the second switching transistor Q2 and the fourth switching transistor Q4 are turned on. Accordingly, in the period T1, the voltage VCF increases in a direction close to the target voltage T_VCF.

Because the average value IL_AVG of the inductor current is negative in the period T2, the direction signal POS_D is at a logic low, and in response to the direction signal POS_D at a logic low, the PWM logic 122 may generate the first switching signal SS1 based on the second PWM signal PWM2, and generate the second switching signal SS2 based on the first PWM signal PWM1.

When the average value IL_AVG of the inductor current is negative, because current flows in the reverse direction, for example, from the fourth node N4 to the second node N2, during the period in which the first switching transistor Q1 and the third switching transistor Q3 are turned on, the third capacitor $C_F$ may be discharged, and the voltage level of the voltage VCF may be reduced. Meanwhile, because current flows in the forward direction, for example, from the second node N2 to the fourth node N4, during the period in which the second switching transistor Q2 and the fourth switching transistor Q4 are turned on, the third capacitor $C_F$ may be charged, and the voltage level of the voltage VCF may increase.

In the period T2, the period in which the first switching transistor Q1 and the third switching transistor Q3 are turned on may be shorter than the period in which the second switching transistor Q2 and the fourth switching transistor Q4 are turned on. Accordingly, in the period T2, the voltage VCF may increase in a direction close to the target voltage T_VCF.

Referring to FIG. 10B, when the voltage VCF is higher than the target voltage T_VCF, the first comparison voltage VPOS may be less than the second comparison voltage VNEG. In the period T1, the average value IL_AVG of the inductor current may be positive, and in the period T2, the average value IL_AVG of the inductor current may be negative.

When the average value IL_AVG of the inductor current is positive, because current flows in the forward direction, for example, from the second node N2 to the fourth node N4, during the period in which the first switching transistor Q1 and the third switching transistor Q3 are turned on, the third capacitor $C_F$ may be charged, and the voltage level of the voltage VCF may increase. Meanwhile, because current flows in the reverse direction, for example, from the fourth node N4 to the second node N2, during the period in which the second switching transistor Q2 and the fourth switching transistor Q4 are turned on, the third capacitor $C_F$ may be discharged, and the voltage level of the voltage VCF may be reduced.

In the period T1, the period in which the first switching transistor Q1 and the third switching transistor Q3 are turned on may be shorter than the period in which the second switching transistor Q2 and the fourth switching transistor Q4 are turned on. Accordingly, in the period T1, the voltage VCF may decrease in a direction close to the target voltage T_VCF.

Because the average value IL_AVG of the inductor current is negative in the period T2, the direction signal POS_D is at a logic low, and in response to the direction signal POS_D at a logic low, the PWM logic 122 may generate the first switching signal SS1 based on the second PWM signal PWM2, and generate the second switching signal SS2 based on the first PWM signal PWM1.

When the average value IL_AVG of the inductor current is negative, because current flows in the reverse direction, for example, from the fourth node N4 to the second node N2, during the period in which the first switching transistor Q1 and the third switching transistor Q3 are turned on, the third capacitor $C_F$ may be discharged, and the voltage level of the voltage VCF may be reduced. Meanwhile, because current flows in the forward direction, for example, from the second node N2 to the fourth node N4, during the period in which the second switching transistor Q2 and the fourth switching transistor Q4 are turned on, the third capacitor $C_F$ may be charged, and the voltage level of the voltage VCF may increase.

In the period T2, the period in which the first switching transistor Q1 and the third switching transistor Q3 are turned on may be longer than the period in which the second switching transistor Q2 and the fourth switching transistor Q4 are turned on. Accordingly, in the period T2, the voltage VCF may be reduced in a direction close to the target voltage T_VCF.

As such, the charger IC (100 in FIG. 1) according to some example embodiments may adjust the voltage VCF between both ends of a flying capacitor, i.e., the third capacitor $C_F$, to be close to the target voltage T_VCF, by adjusting the first and second switching signals SS1 and SS2 controlling switching operations of the first to fourth switching transistors Q1 to Q4 according to whether the average value IL_AVG of the inductor current is positive or negative. The controller 120 may adjust the periods in which each of (or alternatively, at least one of) the first and second switching signals SS1 and SS2 has an active level and an inactive level according to the direction of the inductor current, and thus the bidirectional switching converter 110 may again properly perform flying capacitor balancing.

Figure 11:
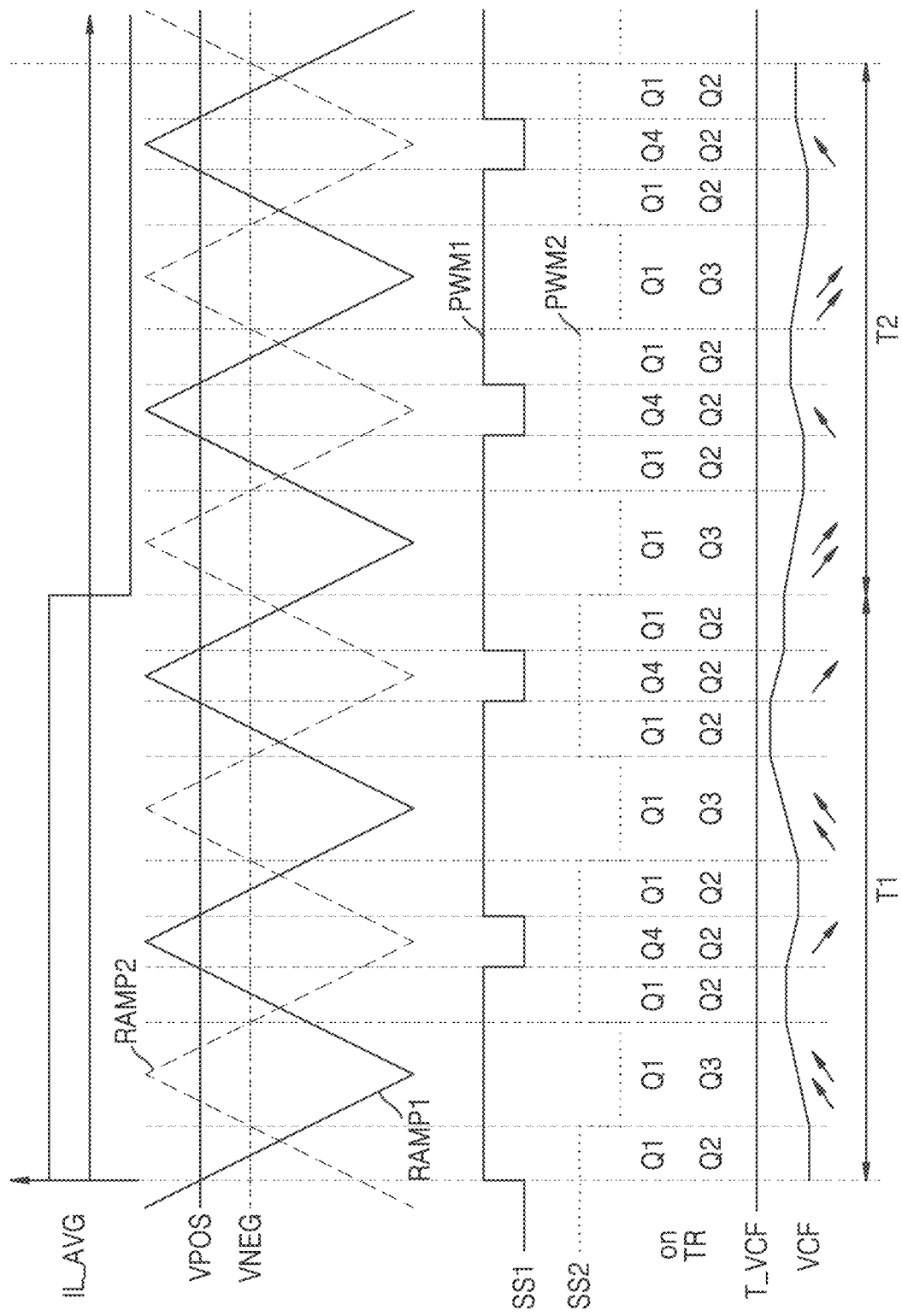
FIG. 11 is a timing diagram of signals of a bidirectional switching converter and a controller according to a comparative example.

FIG. 11 is a timing diagram of signals of the bidirectional switching converter 110 and the controller 120 according to a comparative example.

According to the comparative example, regardless of whether the average value IL_AVG of the inductor current is positive or negative, the PWM logic 122 may generate the first switching signal SS1 based on the first PWM signal PWM1, and generate the second switching signal SS2 based on the second PWM signal PWM2.

During the periods T1 and T2, a period in which the first switching transistor Q1 and the third switching transistor Q3 are turned on may be longer than a period in which the second switching transistor Q2 and the fourth switching transistor Q4 are turned on. During the period T1, the third capacitor $C_F$ may be charged to increase the voltage VCF during the period in which the first switching transistor Q1 and the third switching transistor Q3 are turned on, and the third capacitor $C_F$ may be discharged to reduce the voltage VCF during the period in which the second switching transistor Q2 and the fourth switching transistor Q4 are turned on. Accordingly, in the period T1, the voltage VCF may increase in a direction close to the target voltage T_VCF.

However, because the average value IL_AVG of the inductor current is negative in the period T2, the third capacitor $C_F$ may be discharged to reduce the voltage VCF during the period in which the first switching transistor Q1 and the third switching transistor Q3 are turned on, and the third capacitor $C_F$ may be charged to increase the voltage VCF during the period in which the second switching transistor Q2 and the fourth switching transistor Q4 are turned on. Accordingly, in the period T2, the period in which the first switching transistor Q1 and the third switching transistor Q3 are turned on may be longer than the period in which the second switching transistor Q2 and the fourth switching transistor Q4 are turned on, and thus the voltage VCF may be reduced in a direction away from the target voltage T_VCF.

In this way, unlike the control of the controller 120 according to some example embodiments, when the first and second switching signals SS1 and SS2 are generated irrespective of whether the average value IL_AVG of the inductor current is positive or negative, the bidirectional switching converter 110 may not properly perform flying capacitor balancing.

Figure 12:
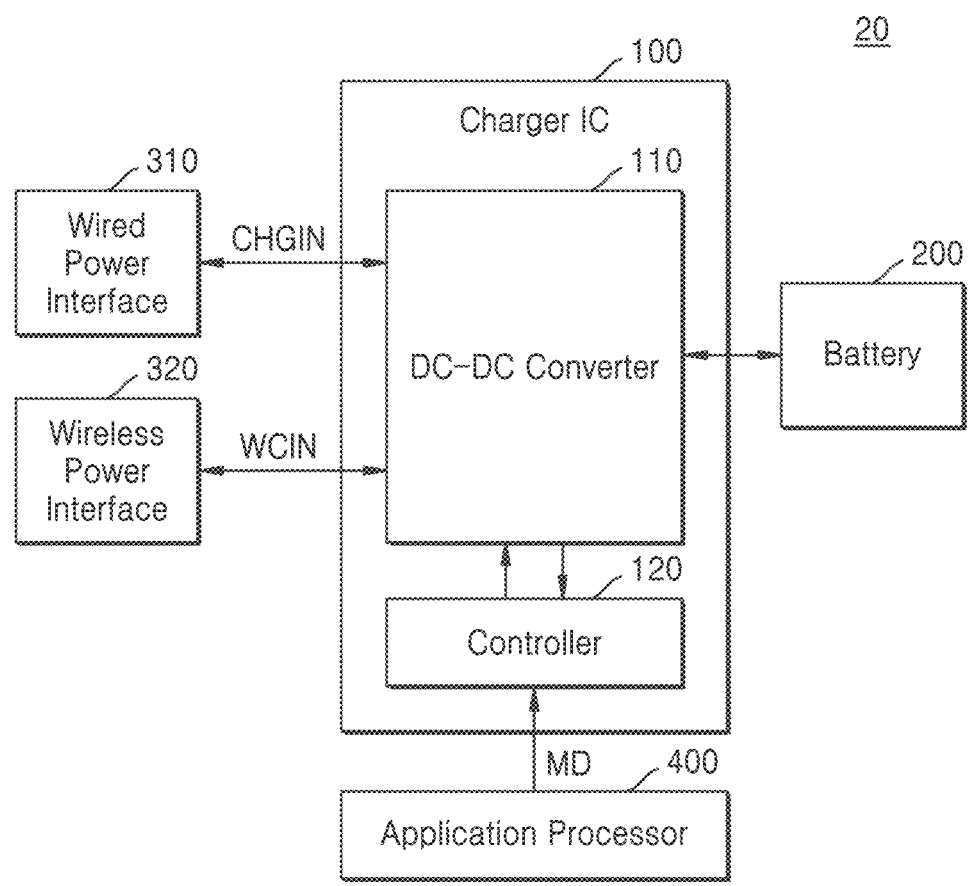
FIG. 12 is a block diagram schematically illustrating an electronic device including a charger IC according to some example embodiments.

FIG. 12 is a block diagram schematically illustrating an electronic device 20 including the charger IC 100 according to some example embodiments.

Referring to FIG. 12, the electronic device 20 may include the charger IC 100, the battery 200, the wired power interface 310, the wireless power interface 320, and an application processor 400. Operations between the charger IC 100, the battery 200, the wired power interface 310, and the wireless power interface 320 have been described with reference to FIG. 1, and thus redundant descriptions thereof will be omitted.

In the electronic device 20 of FIG. 12, the application processor 400 may recognize voltages, for example, the first input voltage CHGIN and the second input voltage WCIN, provided from a device connected to the wired power interface 310 and the wireless power interface 320 or provided from the wired power interface 310 and the wireless power interface 320. The application processor 400 may generate a mode signal MD determining a switching mode according to a recognized interface or input voltage, and provide the mode signal MD to the controller 120 of the charger IC 100.

For example, when the first input voltage CHGIN is applied through the wired power interface 310 and a wireless power transmitting circuit is connected to the wireless power interface 320, the application processor 400 may recognize the first input voltage CHGIN and the wireless power transmitting circuit, and generate the mode signal MD indicating a buck-boost mode. When an OTG device is connected to the wired power interface 310 or the wireless power transmitting circuit is connected to the wireless power interface 320, the application processor 400 may generate the mode signal MD indicating a boost mode.

As such, the application processor 400 may generate the mode signal MD representing a plurality of switching modes and provide the mode signal MD to the controller 120. The controller 120 may control the bidirectional switching converter 110 to perform a switching operation corresponding to the mode signal MD.

Figure 13:
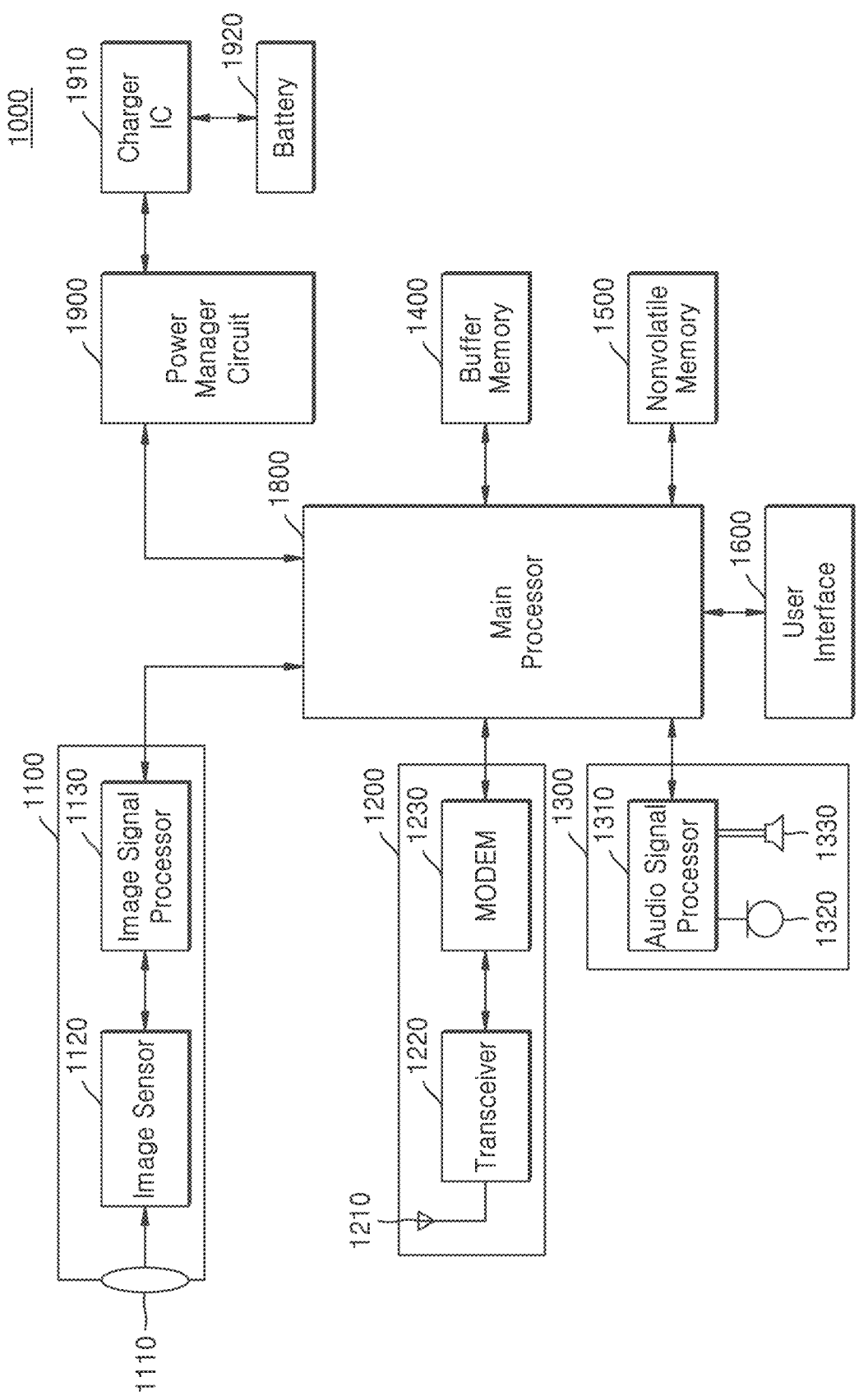
FIG. 13 is a block diagram illustrating a configuration of an electronic device including a charger IC according to some example embodiments.

FIG. 13 is a block diagram illustrating a configuration of an electronic device 1000 including a charger IC 1910 according to some example embodiments.

The electronic device 1000 may include various electronic circuits. For example, the electronic circuits of the electronic device 1000 may include an image processing block 1100, a communication block 1200, an audio processing block 1300, a buffer memory 1400, a nonvolatile memory 1500, a user interface 1600, a main processor 1800, a power manager circuit 1900, and the charger IC 1910.

The electronic device 1000 may be connected to a battery 1920, and the battery 1920 may supply power used for an operation of the electronic device 1000. However, the inventive concept is not limited thereto, and the power supplied to the electronic device 1000 may be provided from an internal/external power source other than the battery 1920.

The image processing block 1100 may receive light through a lens 1110. An image sensor 1120 and an image signal processor 1130 included in the image processing block 1100 may generate image information related to an external object based on the received light.

The communication block 1200 may exchange signals with an external device/system through an antenna 1210. A transceiver 1220 and a modulator/demodulator (MODEM) 1230 of the communication block 1200 may process signals exchanged with the external device/system according to one or more of various wired/wireless communication protocols.

The audio processing block 1300 may process sound information using an audio signal processor 1310. The audio processing block 1300 may receive an audio input through a microphone 1320 and may output audio through a speaker 1330.

The buffer memory 1400 may store data used for an operation of the electronic device 1000. For example, the buffer memory 1400 may temporarily store data processed or to be processed by the main processor 1800. For example, the buffer memory 1400 may include volatile memory such as static random access memory (SRAM), dynamic RAM (DRAM), synchronous DRAM (SDRAM), etc., and/or nonvolatile memory such as phase-change RAM (PRAM), magneto-resistive RAM (MRAM), resistive RAM (Re-RAM), ferro-electric RAM (FRAM), etc.

The nonvolatile memory 1500 may store data regardless of whether power is supplied. For example, the nonvolatile memory 1500 may include at least one of various nonvolatile memories such as flash memory, PRAM, MRAM, ReRAM, FRAM, etc. For example, the nonvolatile memory 1500 may include removable memory such as a secure digital (SD) card or a solid state drive (SSD), and/or embedded memory such as an embedded multimedia card (eMMC).

The user interface 1600 may mediate communication between a user and the electronic device 1000. For example, the user interface 1600 may include an input interface receiving input from the user and an output interface providing information to the user.

The main processor 1800 may control overall operations of components of the electronic device 1000. The main processor 1800 may process various calculations to operate the electronic device 1000. For example, the main processor 1800 may be implemented as a general-purpose processor, a special-purpose processor, an application processor, a microprocessor, etc., and may include one or more processor cores.

The power manager circuit 1900 may supply power to components of the electronic device 1000 and manage the power. For example, the power manager circuit 1900 may output a system voltage based on power provided from the charger IC 1910 and/or the battery 1920. The power manager circuit 1900 may adjust a frequency of each of (or alternatively, at least one of) the components, a voltage level of the provided system voltage, etc., according to temperatures, operation modes (e.g., a performance mode, a standby mode, and a sleep mode), etc. of the components.

The charger IC 1910 may charge the battery 1920 based on power provided from an external power source or may provide power to the power manager circuit 1900. Alternatively, the charger IC 1910 may provide power to an external device through a wired or wireless power interface based on power provided from the battery 1920.

The charger IC 100 described with reference to FIGS. 1 to 12 may be applied to the electronic device 1000 as the charger IC 1910. The charger IC 100 may include a bidirectional switching converter implemented as a 3-level DC-DC converter. The bidirectional switching converter may operate in a buck mode, a buck-boost mode, and a boost mode. In the buck-boost mode, the charger IC 100 may adjust periods in which switching signals controlling a switching operation of a switching element have an active level and an inactive level based on a direction of current flowing through an inductor. Accordingly, flying capacitor balancing may be properly performed, and a ripple of the output voltage may be reduced.

Any of the elements and/or functional blocks disclosed above may include or be implemented in processing circuitry such as hardware including logic circuits; a hardware/software combination such as a processor executing software; or a combination thereof. For example, the controller 120 and application processor 400 may be implemented as processing circuitry. The processing circuitry specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Processor(s), controller(s), and/or processing circuitry may be configured to perform actions or steps by being specifically programmed to perform those action or steps (such as with an FPGA or ASIC) or may be configured to perform actions or steps by executing instructions received from a memory, or a combination thereof.

While the inventive concept has been particularly shown and described with reference to example embodiments thereof, it will be understood that various changes in form and details may be made therein without departing from the spirit and scope of the following claims.

What is claimed is:

1. A charger integrated circuit (IC) comprising:
  a bidirectional switching converter including
    a plurality of switching elements including a first switching element, a second switching element, a third switching element, and a fourth switching element which are connected in series to a first input/output node,
an inductor connected between a first end of the third switching element and a second input/output node, and
a capacitor connected to a second end of the second switching element and a third end of the third switching element; and
a controller configured to generate
a first pulse width modulation (PWM) signal and a second PWM signal based on a plurality of sensing signals received from the bidirectional switching converter,
a first switching signal controlling switching operations of the first switching element and the fourth switching element based on the first PWM signal, and
a second switching signal controlling switching operations of the second switching element and the third switching element based on the second PWM signal in a buck-boost mode in response to an average value of an inductor current flowing through the inductor being positive, and
the first switching signal based on the second PWM signal in response to the average value of the inductor current being negative and the second switching signal based on the first PWM signal in response to the average value of the inductor current being negative.

2. The charger IC of claim 1, wherein, the controller is configured to
in response to the first switching signal having a first level and the second switching signal having a second level, turn on the first switching element and the third switching element, and
in response to the first switching signal having the second level and the second switching signal having the first level, turn on the second switching element and the fourth switching element.

3. The charger IC of claim 2, wherein,
the controller is configured to
in response to the average value of the inductor current being positive, charge the capacitor in a first period in which the first switching element and the third switching element are in an on state, and discharge the capacitor in a second period in which the second switching element and the fourth switching element are in the on state, and
in response to the average value of the inductor current being negative, discharge the capacitor in the first period and charge the capacitor in the second period.

4. The charger IC of claim 3, wherein the controller is configured to cause
in response a voltage between both ends of the capacitor being less than a target voltage and the average value of the inductor current being positive, the first period to be longer than the second period, and
in response to the voltage between both ends of the capacitor being less than the target voltage and the average value of the inductor current being negative, the second period to be longer than the first period.

5. The charger IC of claim 3, wherein the controller is configured to cause
in response to a voltage between both ends of the capacitor being greater than a target voltage and the average value of the inductor current being positive, the second period to be longer than the first period, and in response to the voltage between both ends of the capacitor being greater than the target voltage and the average value of the inductor current being negative, the first period to be longer than the second period.

6. The charger IC of claim 1, wherein the controller includes:
a modulator configured to generate the first PWM signal and the second PWM signal based on the plurality of sensing signals;
a sensing circuit configured to generate a direction signal of a first level in response to the average value of the inductor current being positive, and generate the direction signal of a second level in response to the average value of the inductor current being negative;
a PWM logic configured to output the first PWM signal as the first switching signal and output the second PWM signal as the second switching signal in response to the direction signal having a first level, and output the second PWM signal as the first switching signal and output the first PWM signal as the second switching signal in response to the direction signal having a second level; and
a gate driver configured to generate a first switching voltage and a fourth switching voltage based on the first switching signal, the first switching voltage and the fourth switching voltage respectively controlling on and off of the first switching element and the fourth switching element, and generate a second switching voltage and a third switching voltage based on the second switching signal, wherein the second switching voltage and the third switching voltage respectively controlling on and off of the second switching element and the third switching element.

7. The charger IC of claim 6, wherein the PWM logic includes:
a first de-multiplexer configured to receive the first PWM signal as a first input to the first de-multiplexer and the second PWM signal as a second input to the first de-multiplexer, and output one of the first input to the first de-multiplexer and the second input to the first de-multiplexer as the first switching signal based on the direction signal; and
a second de-multiplexer configured to receive the second PWM signal as a first input to the second de-multiplexer and the first PWM signal as a second input to the second de-multiplexer, and output one of the first input to the second de-multiplexer and the second input to the second de-multiplexer as the second switching signal based on the direction signal.

8. The charger IC of claim 6, wherein the modulator includes:
an error detection circuit configured to generate a first error voltage and a second error voltage based on
an input voltage applied to the first input/output node or the second input/output node,
an output voltage output from the first input/output node or the second input/output node,
a voltage between both ends of the capacitor, and
the inductor current; and
a comparison circuit configured to
generate a sum of the first error voltage and the second error voltage as a first comparison voltage,
generate a difference between the first error voltage and the second error voltage as a second comparison voltage,
compare the first comparison voltage with a first ramp signal to generate a first PWM signal, and compare the second comparison voltage with a second ramp signal to generate a second PWM signal.

9. The charger IC of claim 8, wherein the error detection circuit is further configured to
generate the first error voltage based on a difference between the output voltage and a reference voltage, and
generate the second error voltage based on a voltage between both ends of the capacitor and the input voltage.

10. The charger IC of claim 1, wherein the controller is further configured to,
in a buck-mode, control switching operations of the plurality of switching elements such that a switching converter provides first power from the first input/output node to the second input/output node,
in a boost mode, control the switching operations of the plurality of switching elements such that the switching converter provides second power from the second input/output node to the first input/output node, and
in a buck-boost mode, control the switching operations of the plurality of switching elements such that the switching converter provides the first power to the second input/output node or provides the second power to the first input/output node.

11. A charger integrated circuit (IC) comprising:
a 3-level bidirectional switching converter; and
a controller, wherein
the 3-level bidirectional switching converter includes
a first switching element connected between a first node and a second node,
a first input voltage is applied to or a first output voltage is output from the first node;
a second switching element connected between the second node and a third node;
a third switching element connected between the third node and a fourth node;
a fourth switching element connected between the fourth node and a fifth node;
a capacitor connected between the second node and the fourth node; and
an inductor connected between the third node and a sixth node, and
the controller is configured to, in a first switching mode,
in response to an average current of the inductor having a positive value, turn on or off the first switching element and the fourth switching element based on a first pulse width modulation (PWM) signal, turn on and off the second switching element and the third switching element based on a second PWM signal and
in response to the average current of the inductor having a negative value, turn on or off the first switching element and the fourth switching element based on the second PWM signal, and turn on and off the second switching element and the third switching element based on the first PWM signal.

12. The charger IC of claim 11, wherein the controller is further configured to,
in response to the average current of the inductor having a positive value, generate a first switching voltage and a fourth switching voltage respectively controlling switching operations of the first switching element and the fourth switching element based on the first PWM signal, and generate a second switching voltage and a third switching voltage respectively controlling switching operations of the second switching element and the third switching element based on the second PWM signal, and
in response to the average current of the inductor having a negative value, generate the first switching voltage and the fourth switching voltage based on the second PWM signal, and generate the second switching voltage and the third switching voltage based on the first PWM signal.

13. The charger IC of claim 12, wherein the controller includes
a sensing circuit configured to determine whether the average current of the inductor has the positive value or the negative value;
a modulator configured to generate the first PWM signal and the second PWM signal based on an inductor current and a plurality of sensing voltages received from the first node, the second node, the fourth node, and the sixth node;
a PWM logic configured to
generate a first switching signal based on the first PWM signal and generate a second switching signal based on the second PWM signal in response to the average current of the inductor having the positive value, and
generate the first switching signal based on the second PWM signal and generate the second switching signal based on the first PWM signal in response to the average current of the inductor having the negative value; and
a gate driver configured to generate the first switching voltage and the fourth switching voltage based on the first switching signal, and generate the second switching voltage and the third switching voltage based on the second switching signal, wherein a phase of the first switching voltage is opposite to a phase of the fourth switching voltage, and a phase of the second switching voltage is opposite to a phase of the third switching voltage.

14. The charger IC of claim 11, wherein
in response to the average current of the inductor having the positive value, a first period in which the first switching element and the third switching element are turned on is longer than a second period in which the second switching element and the fourth switching element are turned on, and
in response to the average current of the inductor having the negative value, the first period is shorter than the second period.

15. The charger IC of claim 14, wherein
in response to the average current of the inductor having the positive value, the capacitor is charged in the first period, and the capacitor is discharged in the second period, and
in response to the average current of the inductor having the negative value, the capacitor is discharged in the first period, and the capacitor is charged in the second period.

* * * * *